United States Patent
Liaw

(10) Patent No.: US 9,257,439 B2
(45) Date of Patent: Feb. 9, 2016

(54) STRUCTURE AND METHOD FOR FINFET SRAM

(71) Applicant: Taiwan Semiconductor Manufacturing Company, Ltd., Hsin-Chu (TW)

(72) Inventor: Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 90 days.

(21) Appl. No.: 14/191,789

(22) Filed: Feb. 27, 2014

(65) Prior Publication Data

US 2015/0243667 A1 Aug. 27, 2015

(51) Int. Cl.
*H01L 27/11* (2006.01)
*H01L 27/088* (2006.01)
*G06F 17/50* (2006.01)
*H01L 23/528* (2006.01)
*H01L 27/02* (2006.01)

(52) U.S. Cl.
CPC ........ *H01L 27/1104* (2013.01); *G06F 17/5068* (2013.01); *H01L 23/528* (2013.01); *H01L 27/0207* (2013.01); *H01L 27/0886* (2013.01); *H01L 27/1116* (2013.01)

(58) Field of Classification Search
CPC ............ H01L 27/0207; H01L 27/0886; H01L 27/1104; H01L 27/1116
See application file for complete search history.

(56) References Cited

U.S. PATENT DOCUMENTS

| 6,977,837 B2* | 12/2005 | Watanabe ............ G11C 11/412 365/156 |
| 7,812,373 B2* | 10/2010 | Bauer ................. H01L 27/0207 257/206 |
| 8,621,398 B2* | 12/2013 | Shen ............... H01L 21/823431 716/132 |
| 8,964,453 B2* | 2/2015 | Lin ...................... G11C 11/419 365/154 |
| 2009/0017628 A1 | 1/2009 | Kim et al. |
| 2013/0094035 A1* | 4/2013 | Chang ....................... G03F 1/68 358/1.9 |

OTHER PUBLICATIONS

Yasuhiro Fukaura et al., "A Highly Manufacturable High Density Embedded SRAM Technology for 90nm CMOS," Published Devices Meeting, 2002, IEDM '02 International, pp. 415-418, San Francisco, CA, USA.

* cited by examiner

*Primary Examiner* — Allison P Bernstein
(74) *Attorney, Agent, or Firm* — Haynes and Boone, LLP

(57) ABSTRACT

Provided is an embedded FinFET SRAM structure and methods of making the same. The embedded FinFET SRAM structure includes an array of SRAM cells. The SRAM cells have a first pitch in a first direction and a second pitch in a second direction orthogonal to the first direction. The first and second pitches are configured so as to align fin active lines and gate features of the SRAM cells with those of peripheral logic circuits. A layout of the SRAM structure includes three layers, wherein a first layer defines mandrel patterns for forming fins, a second layer defines a first cut pattern for removing dummy fins, and a third layer defines a second cut pattern for shortening fin ends. The three layers collectively define fin active lines of the SRAM structure.

20 Claims, 29 Drawing Sheets

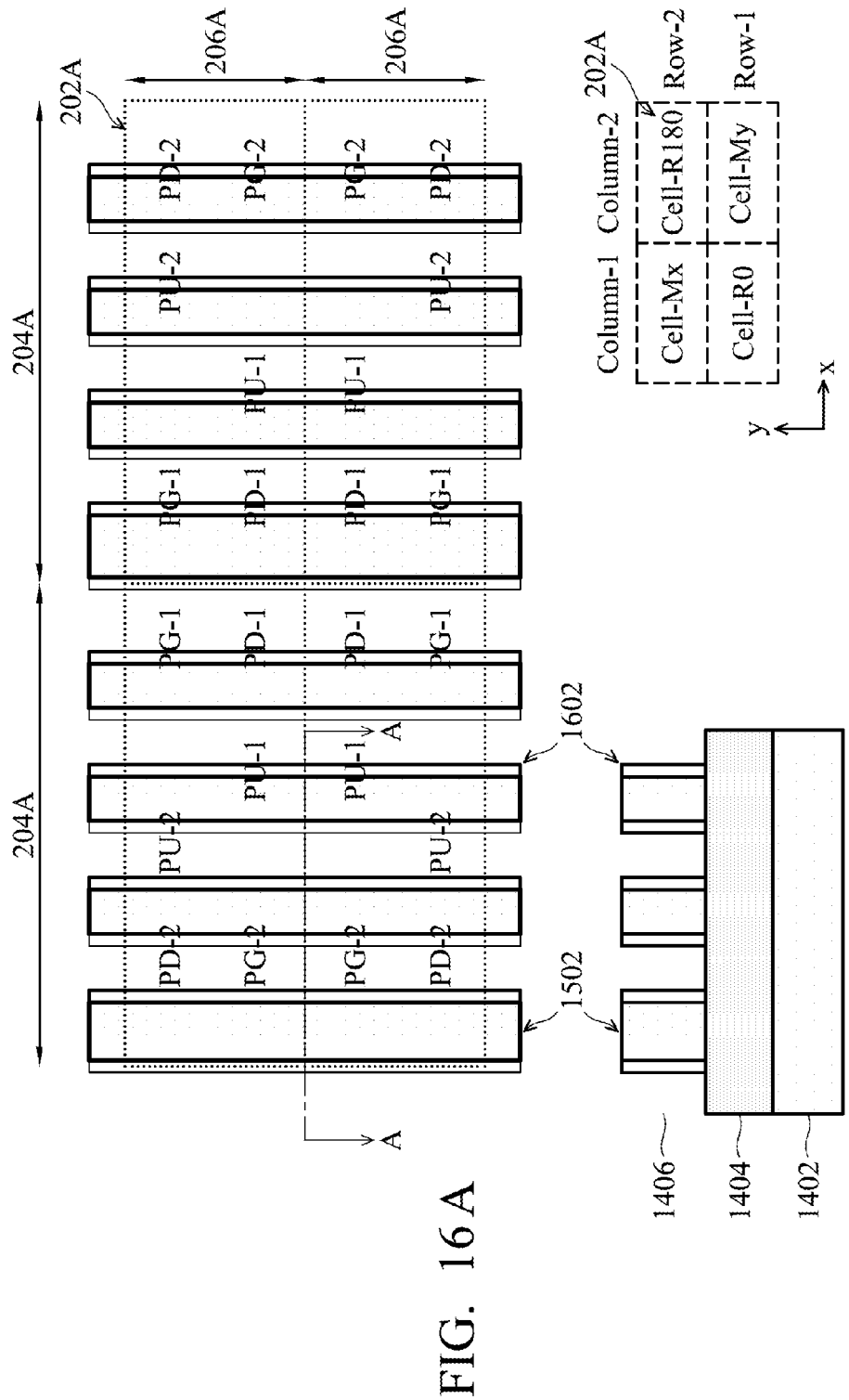

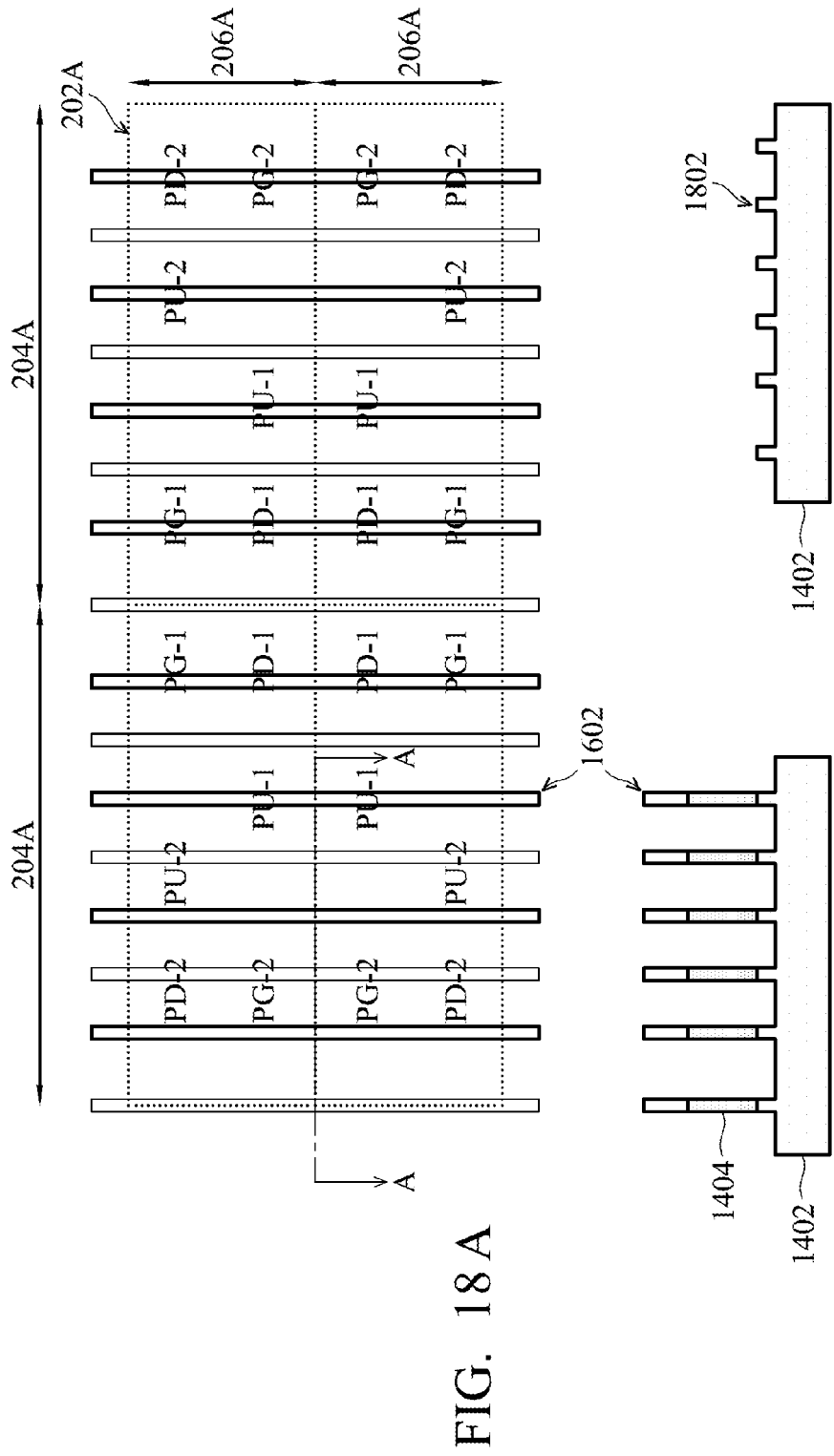

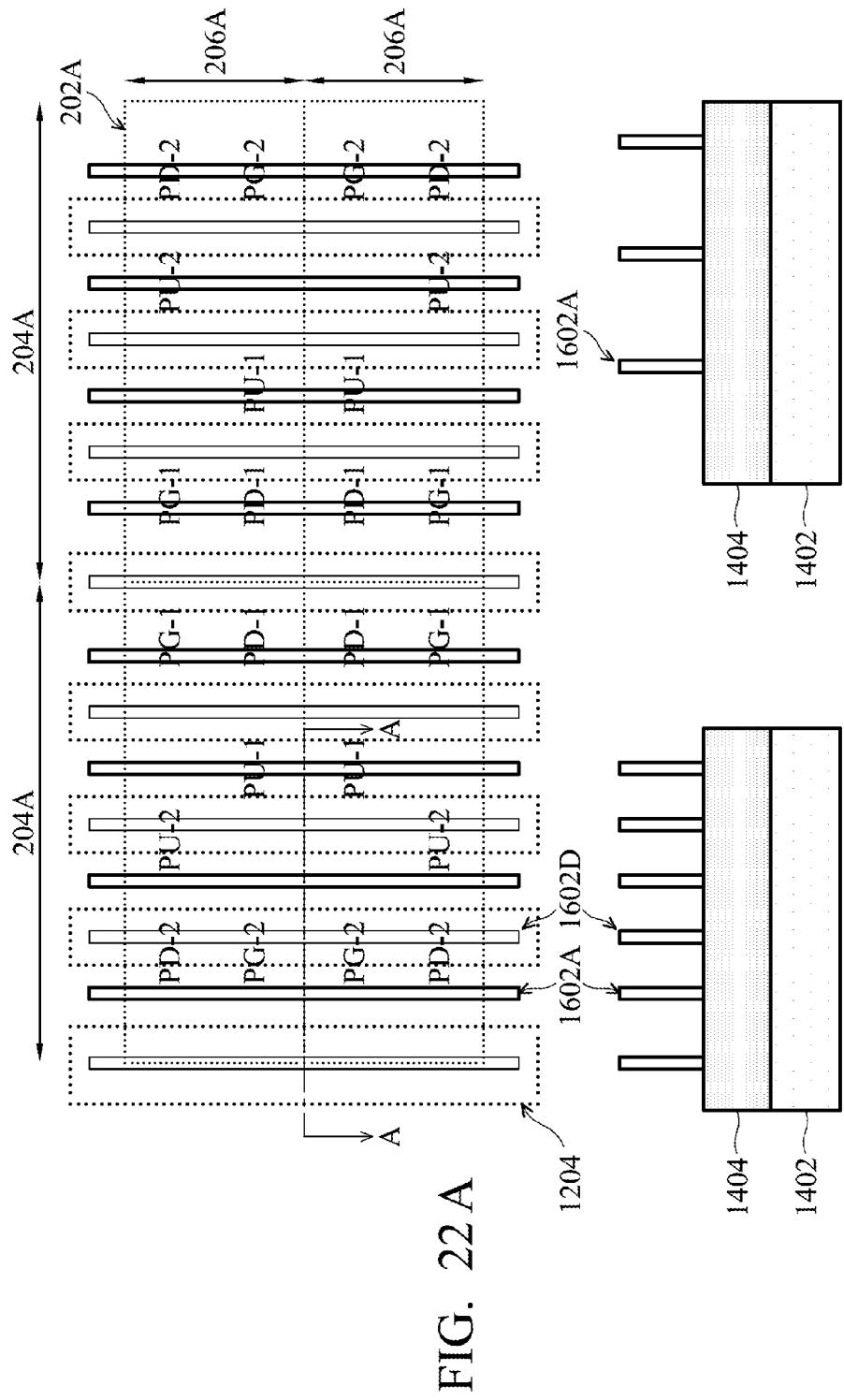

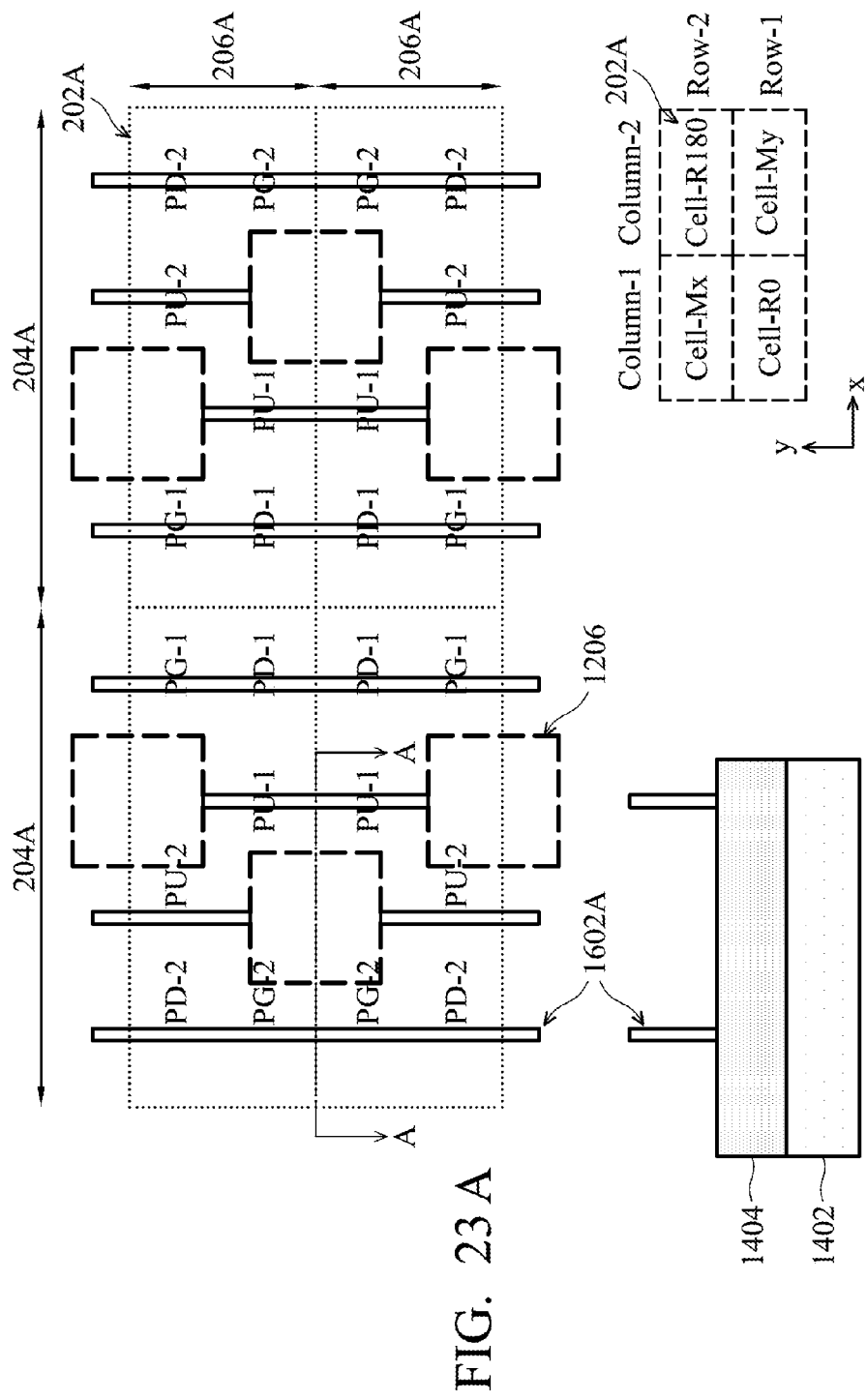

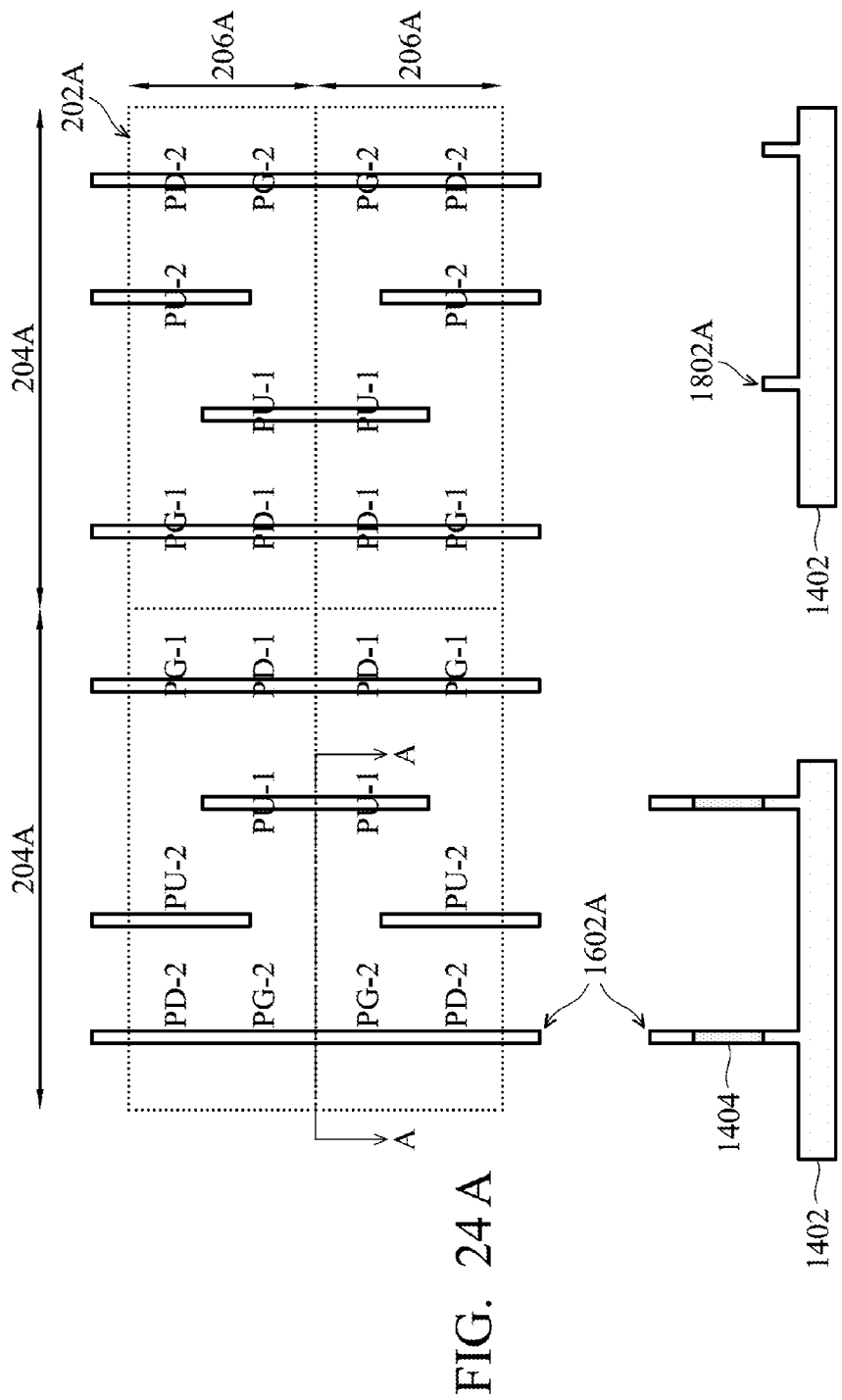

STRUCTURE AND METHOD FOR FINFET SRAM

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, logic circuits and embedded static random-access memory (SRAM) cells are frequently integrated into semiconductor devices for increased functional density. Such applications range from industrial and scientific subsystems, automotive electronics, cell phones, digital cameras, microprocessors, and so on. To meet the demand for higher SRAM density, simply scalding down the semiconductor feature size is no longer enough. For example, traditional SRAM cell structure with planar transistors has experienced degraded device performance and higher leakage when manufactured with smaller semiconductor geometries. One of the techniques for meeting such a challenge is to use three-dimensional transistors having a fin or multi-fin structure (e.g., FinFETs). For example, FinFETs can be implemented for controlling short channel effect for metal-oxide-semiconductor field-effect transistors (MOSFETs). To achieve optimal short channel control and area reduction, the fin structures are desired to be as thin as possible. One of the techniques for manufacturing very thin fin structures is spacer lithography. For example, spacers are formed on sidewalls of mandrel patterns. After the mandrel patterns are removed, the spacers become an etch mask for etching a silicon substrate in forming the fin structures. The dimensions of the mandrel patterns and spacers control the width and pitch of the fin structures. A tight control of critical dimension (CD) uniformity of the mandrel patterns and spacers is a design challenge for embedded FinFET SRAM.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 14-20B illustrate top and/or cross-sectional views of a portion of embedded SRAM cells manufactured with the method in FIG. 13, in accordance with an embodiment.

FIGS. 22A-24C illustrate top and/or cross-sectional views of a portion of embedded SRAM cells manufactured with the method in FIG. 21, in accordance with an embodiment.

DETAILED DESCRIPTION

Figure 1:
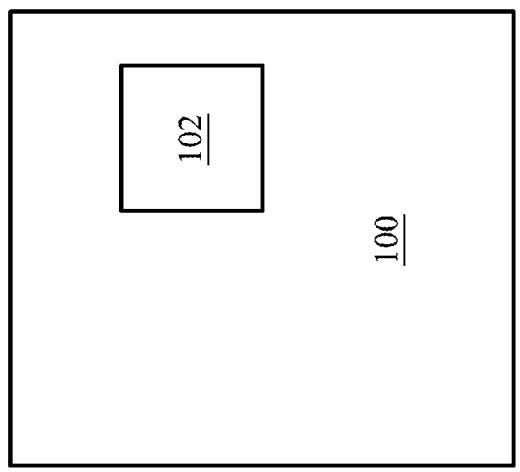
FIG. 1 is a simplified block diagram of an integrated circuit (IC) with embedded SRAM cells, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a semiconductor device 100 with an SRAM macro 102. The semiconductor device can be, e.g., a microprocessor, an application specific integrated circuit (ASIC), a field programmable gate array (FPGA), or a digital signal processor (DSP). The exact functionality of the semiconductor device 100 is not a limitation to the provided subject matter.

Figure 2:
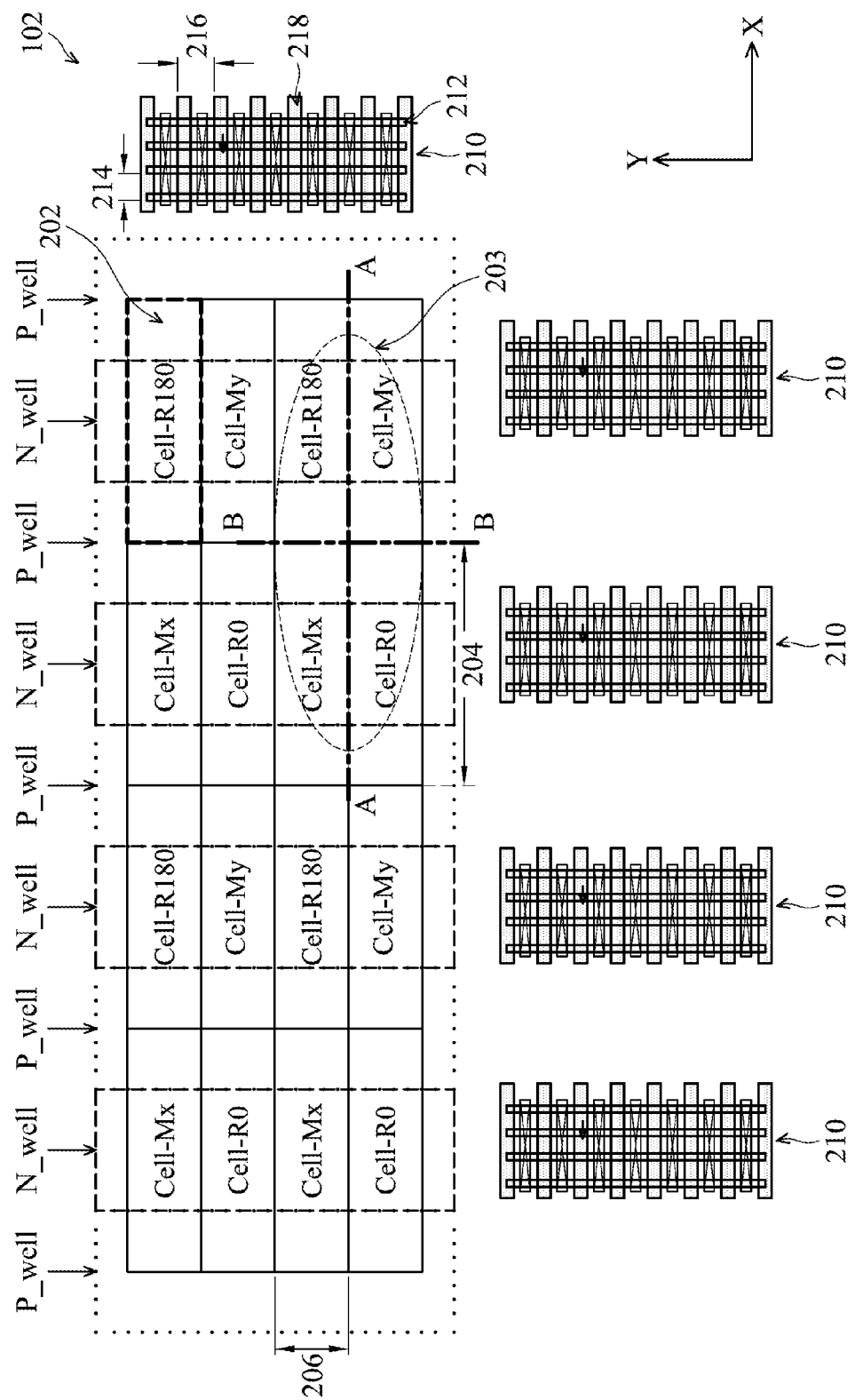
FIG. 2 shows embedded SRAM cells with peripheral logic circuits, according to various aspects of the present disclosure.

FIG. 2 shows a more detailed view of a portion of the SRAM macro 102, according to various aspects of the present disclosure. Referring to FIG. 2, the SRAM macro 102 includes a plurality of SRAM cells 202 and a plurality of peripheral logic circuits 210. Each SRAM cell 202 is used to store one memory bit, while the peripheral logic circuits 210 are used to implement various logic functions, such as write and/or read address decoder, word/bit selector, data drivers, memory self-testing, etc. The logic circuits 210 include a plurality of FinFETs having gate features 218 and fin active lines 212. Although not shown, each of the SRAM cells 202 also includes a plurality of FinFETs having gate features and fin active lines. In addition, even though FIG. 2 shows only 16 SRAM cells 202, the SRAM macro 102 may include a large number of SRAM cells 202 for a given semiconductor device 100. For example, the SRAM macro 102 may include thousands or millions of the SRAM cells 202.

As shown in FIG. 2, the SRAM cells 202 are formed over a plurality of P-wells or P-diffusions (e.g., for n-type FinFETs or N-FinFETs) and N-wells or N-diffusions (e.g., for p-type FinFETs or P-FinFETs) wherein the P-wells and the N-wells are rectangular semiconductor regions arranged in alternating order in an X direction. As will be shown in later, each of the SRAM cells 202 includes a plurality of N-FinFETs and a plurality of P-FinFETs. Furthermore, the SRAM cells 202 are arranged in an array with one SRAM cell abutting another. Each of the SRAM cells 202 occupies a rectangular region of the SRAM macro 102 wherein the rectangular region has a first dimension 204 in the X direction and a second dimension 206 in a Y direction that is orthogonal to the X direction. In the following discussion, the first dimension 204 is also referred to as the SRAM cell 202's X-pitch, and the second dimension 206 the SRAM cell 202's Y-pitch.

Furthermore, each of the SRAM cells 202 is configured in one of four orientations. As shown in FIG. 2, a group 203 includes four SRAM cells 202 in a two-by-two array, denoted as Cell-R0, Cell-Mx, Cell-My, and Cell-R180 for the convenience of discussion. In an embodiment, the gate features and fin active lines of the Cell-R0 are mirror images (or reflection) of those respective features of the Cell-Mx with respect to an imaginary lines A-A through a geometric center of the group 203 in the X direction. Similarly, the gate features and fin active lines of the Cell-R0 are mirror images of those respective features of the Cell-My with respect to an imaginary lines B-B through the geometric center of the group 203 in the Y direction. Similarly, the Cell-R180 is a mirror image of the Cell-Mx with respect to the imaginary lines B-B, and a mirror image of the Cell-My with respect to the imaginary lines A-A.

As semiconductor technology has progressed into small feature sizes, such as 32 nanometer (nm), 20 nm, and beyond, restricted design rules are often followed so as to improve design manufacturability. The configuration of the SRAM macro 102, as shown in FIG. 2, allows alignment of the features of the peripheral logic circuits 210 (e.g., the gate features 218 and fin active lines 212) with those respective features of the SRAM cells 202. This can be accomplished by careful consideration of ratios between the X-pitch 204 and fin pitch 214, and between the Y-pitch 206 and gate pitch 216. Such alignment enables dense fin active line definition and formation thereby providing many benefits, such as higher SRAM cell density, higher manufacturing reliability in view of optical proximity effect, etc. Furthermore, having a fixed ratio between the Y-pitch 206 and gate pitch 216 allows certain peripheral logic circuits (e.g., word-line drivers, decoders, etc.) to be automatically generated as a circuit block which is then repetitively placed along the SRAM cells. Similarly, having a fixed ratio between the X-pitch 204 and fin pitch 214 allows certain peripheral logic circuits (e.g., column selector, bit-line pre-charge circuit, decoders, etc.) to be automatically generated and placed.

Figure 3:
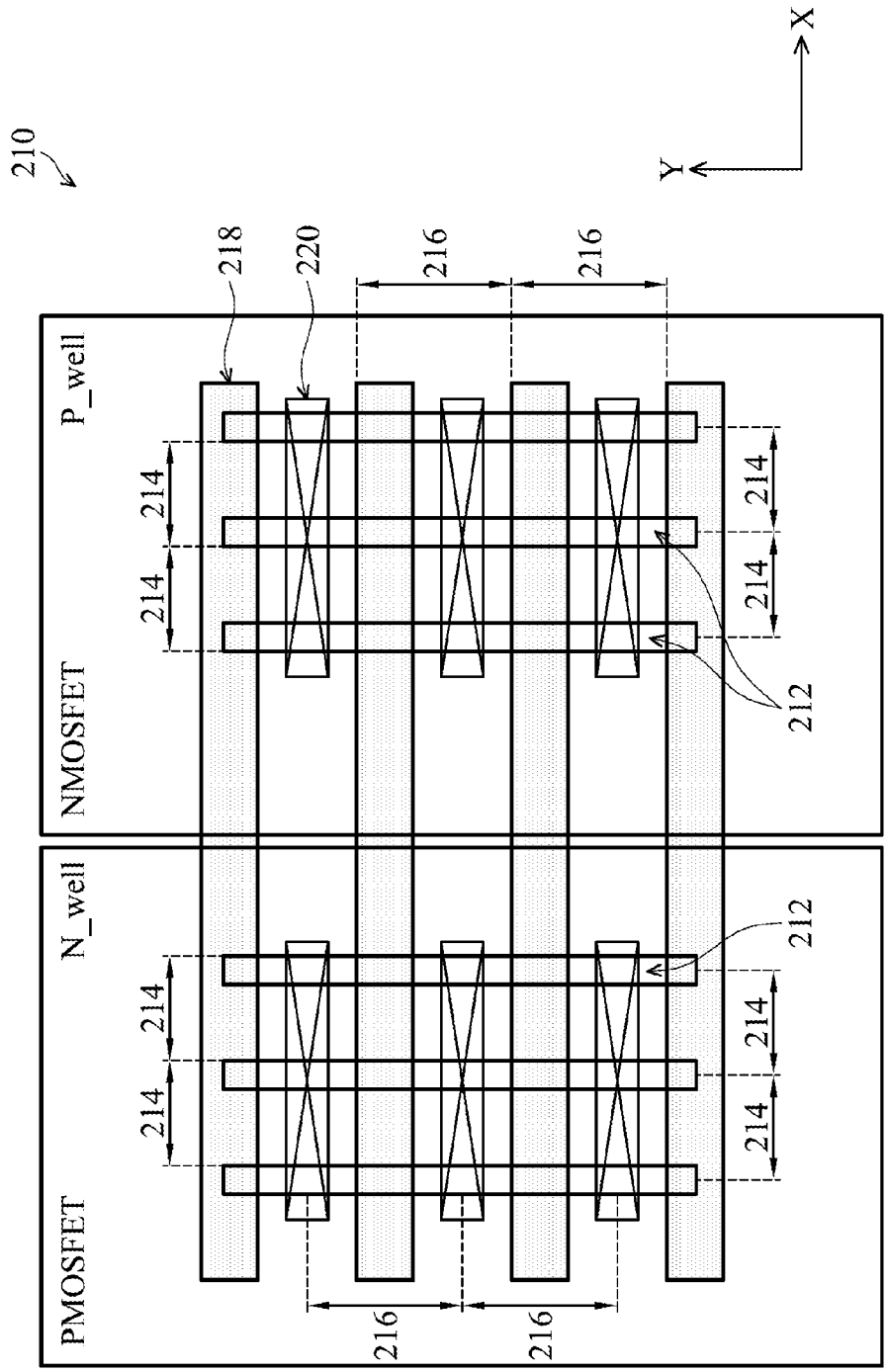
FIG. 3 illustrates some components of the peripheral logic circuit of FIG. 2, in accordance with an embodiment.

FIG. 3 illustrates a top view of a portion of the peripheral logic circuit 210. Each of the fin active lines 212 has a rectangular shape with its long edge extending in the Y direction and its short edge extending in the X direction. In the present embodiment, the fin pitch 214 is defined as the edge-to-edge spacing between two adjacent fin active lines 212. Alternatively, the fin pitch 214 may be defined as the center-line-to-center-line spacing between two adjacent fin active lines 212. The gate features 218 are oriented orthogonally with respect to the fin active lines 212. Each of the gate features 218 has a rectangular shape with its long edge extending in the X direction and its short edge extending in the Y direction. In the present embodiment, the gate pitch 216 is defined as the edge-to-edge spacing between two adjacent gate features 218. Alternatively, the gate pitch 216 may be defined as the center-line-to-center-line spacing between two adjacent gate features 218. The peripheral logic circuit 210 further includes a plurality of active contacts 220 that couple multiple fin active lines 212 to form common drains/sources for respective FinFETs.

Figure 4A:
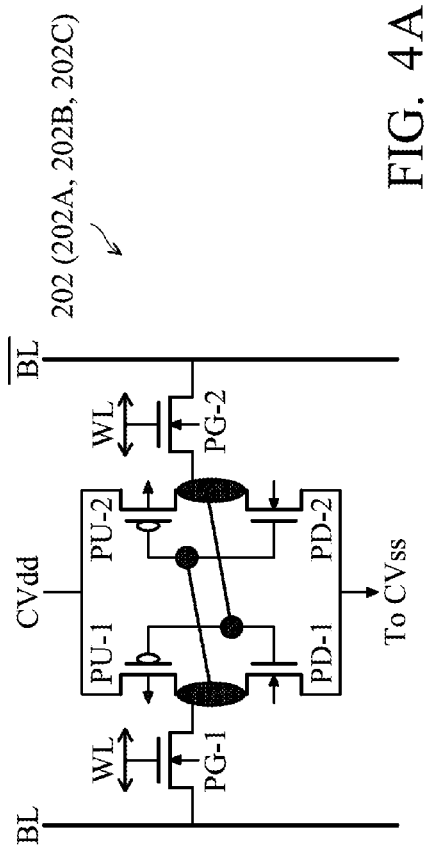
FIGS. 4A and 4B show schematic views of a six-transistor (6T) single-port (SP) SRAM cell, in accordance with an embodiment.
Figure 4B:
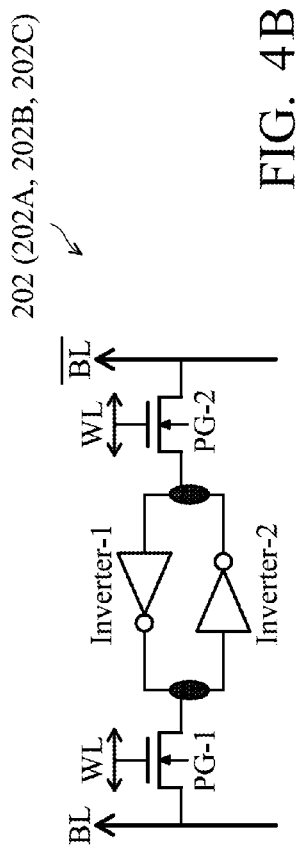

FIG. 4A shows a schematic view of a six-transistor (6T) single port (SP) SRAM cell that may be implemented as the SRAM cell 202 of FIG. 2. Referring to FIG. 4A, the 6T SP SRAM cell 202, includes two P-FinFETs as pull-up transistors, PU-1 and PU-2; two N-FinFETs as pull-down transistors, PD-1 and PD-2; and two N-FinFETs as pass-gate transistors, PG-1 and PG-2. The PU-1 and PD-1 are coupled to form an inverter (Inverter-1 in FIG. 4B). The PU-2 and PD-2 are coupled to form another inverter (Inverter-2 in FIG. 4B). The inverters, Inverter-1 and Inverter-2, are cross-coupled to form a storage unit of the SRAM cell 202. FIG. 4A further shows word line (WL), bit line (BL), and bit line bar (BL) for accessing the storage unit of the SRAM cell 202.

In practice, the SRAM cell 202 of FIG. 4A can be implemented physically (e.g., layout) in many ways. The following discussion will describe some layout designs of three embodiments of the SRAM cell 202, namely, SRAM cells 202A, 202B, and 202C, according to various aspects of the present disclosure. A person having ordinary skill in the art should appreciate that these three embodiments are merely examples and are not intended to limit the inventive scope of the provided subject matter.

Figure 5:
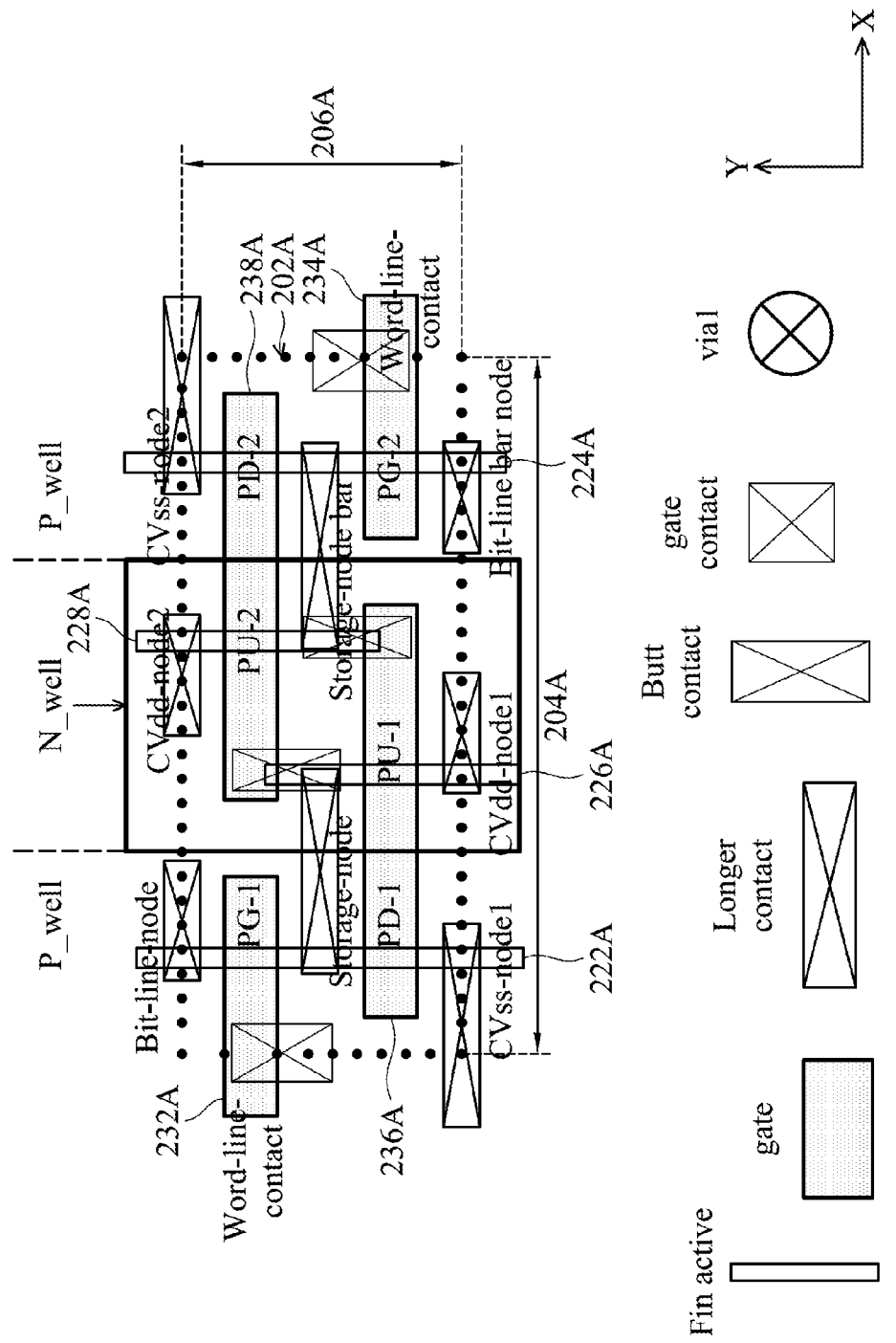
FIGS. 5-7 show a portion of a layout of the 6T SP SRAM cell of the FIG. 4A, in accordance with some embodiments.

FIG. 5 shows a top view of a portion of the SRAM macro 102's layout including the SRAM cell 202A. Referring to FIG. 5, the SRAM cell 202A is indicated with a rectangular boundary (a dotted line) with a first dimension (X-pitch) 204A and a second dimension (Y-pitch) 206A. The layout includes one N-well active region and two P-well active regions, one on each side of the N-well active region in the X direction. The layout further includes two fin active lines, 222A and 224A, with one in each of the P-well active regions, extending lengthwise in the Y direction and overlapping the SRAM cell 202A. The layout further includes two fin active lines, 226A and 228A, in the N-well active region, extending lengthwise in the Y direction and partially overlapping the SRAM cell 202A. The fin active lines 226A and 228A are shortened for reducing cell area. The four fin active lines, 222A, 226A, 228A, and 224A, are spaced edge-to-edge by about twice of the fin pitch 214. In some embodiments, the spacing between these fin active lines are set to between about 2 and about 2.5 times of the fin pitch 214 to allow enough design margin and process margin when forming the SRAM cell fin lines. In such cases, the X-pitch 204A can still be maintained as an integer multiple of the fin pitch 214. Furthermore, the layout includes two gate features, 232A and 234A, extending lengthwise in the X direction and partially overlapping the SRAM cell 202A and being shared between the SRAM cell 202A and adjacent SRAM cells (not shown), and two gate features, 236A and 238A, extending lengthwise in the X direction within the SRAM cell 222A. The above gate features and the fin active lines collectively define the six transistors, PU-1/2, PD-1/2, and PG-1/2 of FIG. 4A. The Y-pitch 206A is substantially equal to the sum of the pass-gate transistor (PG-1 or PG-2) pitch and the pull-down transistor (PD-1 or PD-2) pitch, wherein a transistor's pitch refers to a distance between the transistor's source and drain.

In an embodiment, the Y-pitch 206A is set to be about twice of the gate pitch 216 (FIG. 3), while the X-pitch 204A is set to be about 8, 8.5, or 9 times of the fin pitch 214 (FIG. 3). Such settings take into account the fact that proper alignment of respective features between the SRAM cells 202A and the peripheral logic circuits 210 improves overall manufacturability of the semiconductor device 100 having the SRAM macro 102 (FIGS. 1 and 2). For example, having a single fin pitch rule among the SRAM cells 202A and the peripheral circuits 210 helps improve fin active lines' critical dimension uniformity during lithography process. Due to its compact layout, the SRAM cell 202A is well-suited for high density embedded SRAM applications. In an embodiment where high memory cell density is desired, the SRAM macro 102 (FIG. 2) includes only this type of SRAM cell and the X-pitch 204A is set to about 8 times of the fin pitch 214 (FIG. 3). In another embodiment, the X-pitch 204A is set to about 9 times of the fin pitch 214. In some embodiments, the X-pitch 204A is set to a non-integer multiple of the fin pitch 214, such as 8.5 times. That is made possible by the configuration of the SRAM cells 202A in the SRAM macro 102 (FIG. 2) wherein four adjacent SRAM cells 202A will collectively have an X-dimension that is an integer multiple (e.g., 34x) of the fin pitch 214. Such flexibility in placing the SRAM cells 202A yet still maintaining proper alignment of fin active lines between the SRAM cells 202A and the peripheral logic circuits 210 is one of the many benefits provided by the present disclosure.

Figure 6:
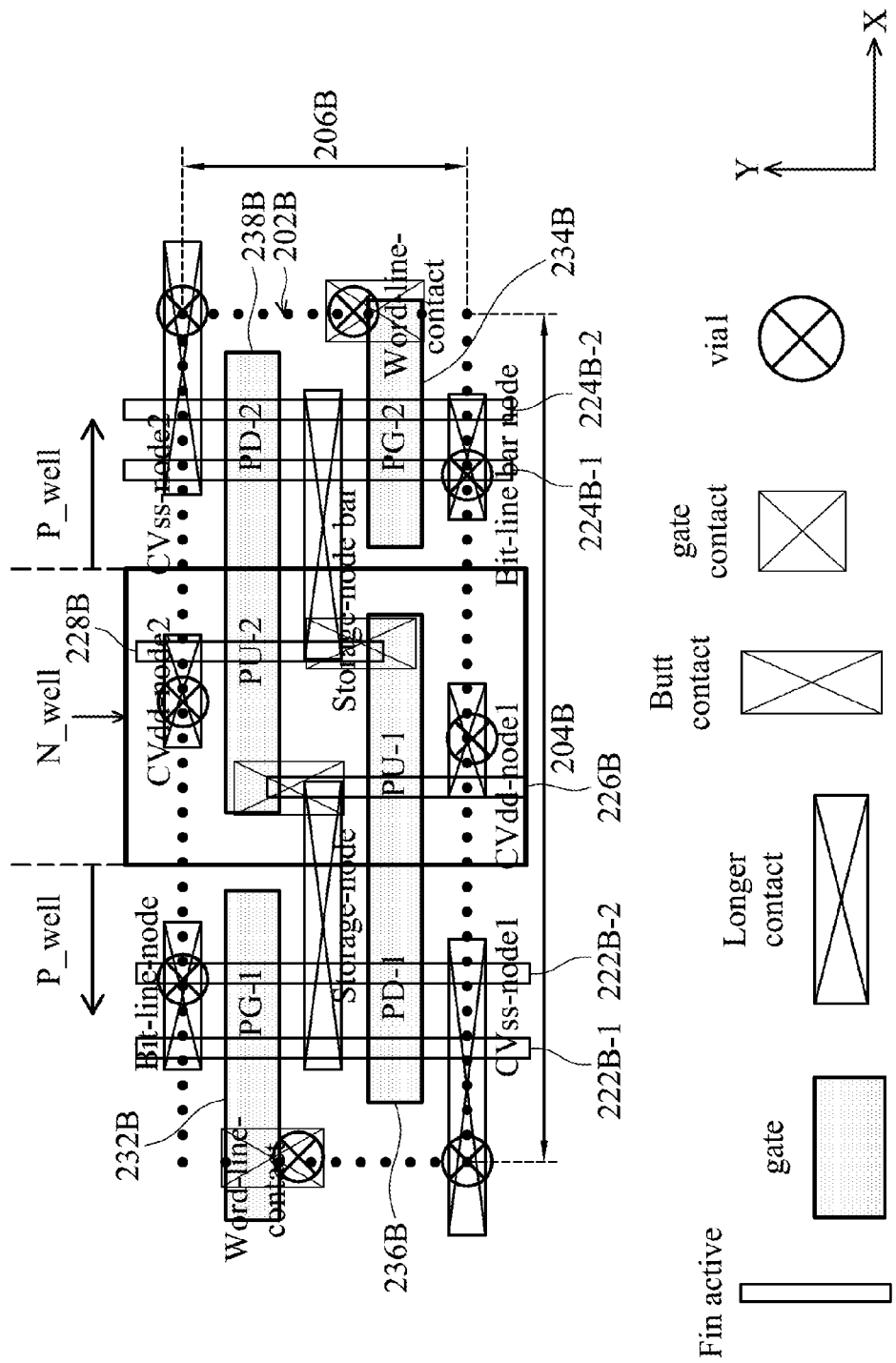
Figure 7:
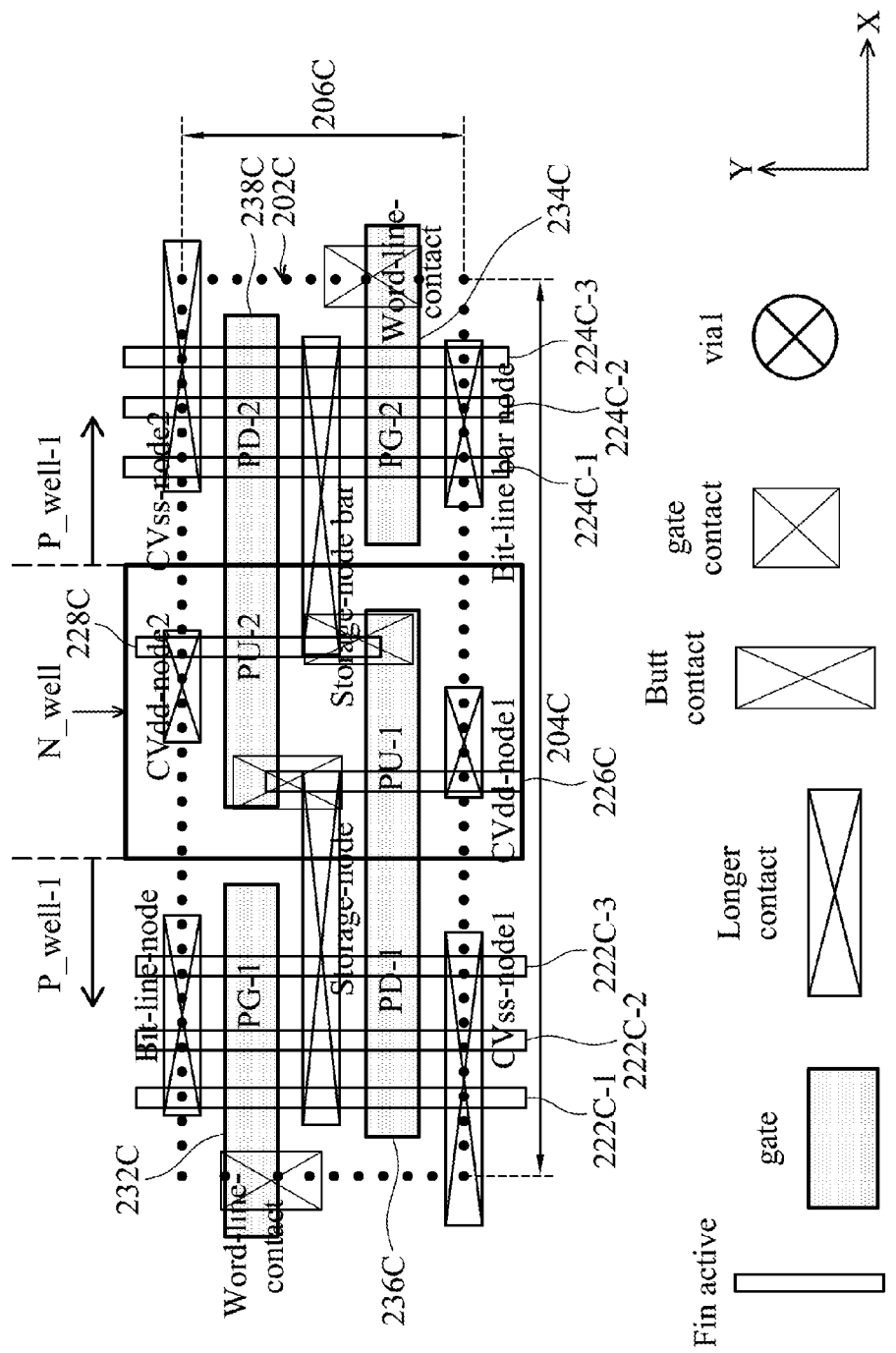

FIG. 6 shows a portion of the SRAM cell 202B's layout, while FIG. 7 shows a portion of the SRAM cell 202C's layout. Many aspects of the SRAM cells 202B and 202C are similar to those of the SRAM cell 202A, and are hereby omitted from discussion for brevity.

Referring to FIG. 6, the SRAM cell 202B is indicated with a rectangular boundary (a dotted line) with a first dimension (X-pitch) 204B and a second dimension (Y-pitch) 206B. One difference between the SRAM cells 202B and 202A is that the SRAM cell 202B includes two fin active lines in each of the two P-well active regions, 222B-1/2 and 224B-1/2. In effect, the transistors PG-1/2 and PD-1/2 of the SRAM cell 202B have dual-fin active lines for increased current sourcing capability. The two fins 222B-1 and 222B-2 are spaced edge-to-edge by one fin pitch 214, so are the two fins 224B-1 and 224B-2. In the present embodiment, the X-pitch 204B is greater than the X-pitch 204A (FIG. 5) by about twice of the fin pitch 214 (FIG. 3). For similar reasons stated above with respect to FIG. 5, the Y-pitch 206B is about twice of the gate pitch 216. In an embodiment, a ratio between the X-pitch 204B and the Y-pitch 206B is in a range of about 2.7 to about 2.9.

Similar observations are made with respect to the SRAM cell 202C in FIG. 7: the transistors PG-1/2 and PD-1/2 of the SRAM cell 202C have triple-fin active lines 222C-1/2/3 and 224C-1/2/3 respectively for increased current sourcing capability; the X-pitch 204C is greater than the X-pitch 204A (FIG. 5) by about four times of the fin pitch 214 (FIG. 3); and the Y-pitch 206C is about twice of the gate pitch 216 (FIG. 3). The three fins 222C-1, 222C-2, and 222C-3 are spaced edge-to-edge by one fin pitch 214, so are the three fins 224C-1, 2224-2, and 2224-3.

Figure 8:
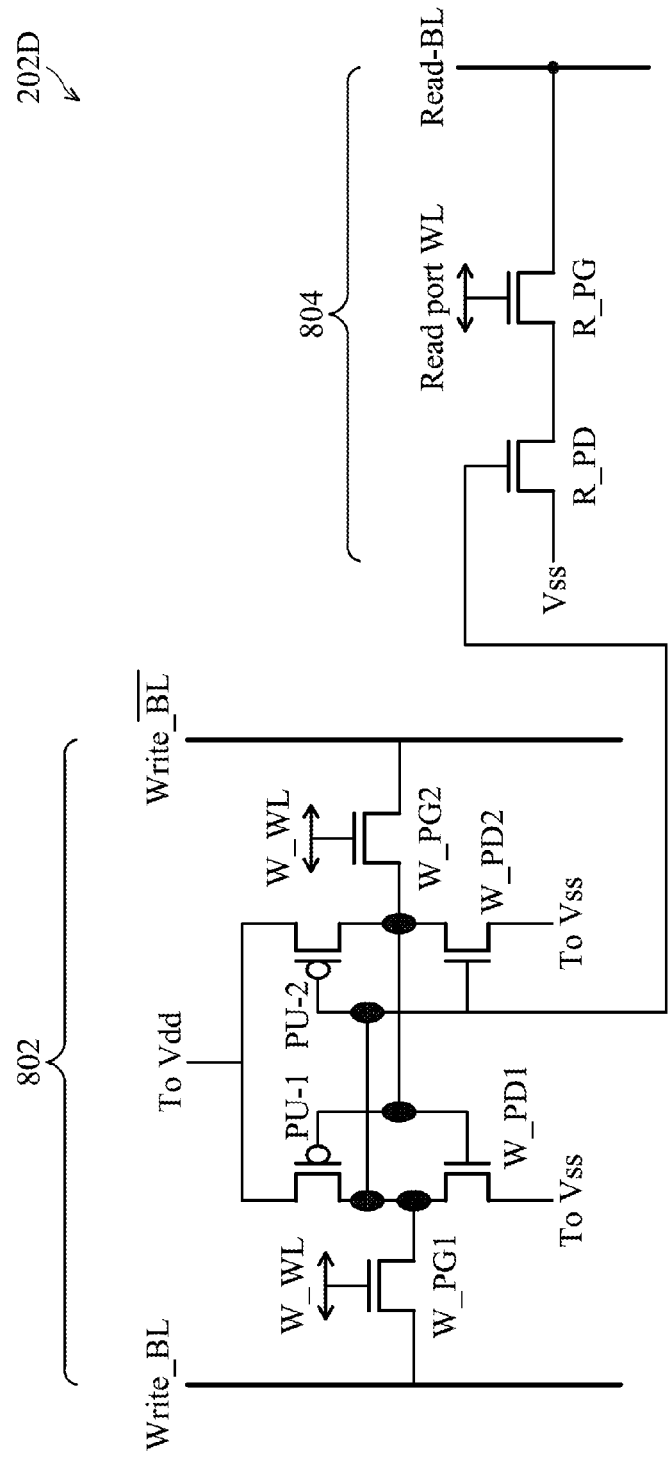
FIG. 8 shows a schematic view of a two-port (TP) SRAM cell, in accordance with an embodiment.

FIG. 8 shows a schematic view of a two-port (TP) SRAM cell 202D that may be implemented as the SRAM cell 202 of FIG. 2. The SRAM cell 202D, as shown in FIG. 8, includes a write-port portion 802 and a read-port portion 804. The write-port portion 802 is effectively a 6T SP SRAM cell as shown in FIG. 4A. The read-port portion 804 includes a read pull-down transistor R_PD and read pass-gate transistor R_PG.

Figure 9:
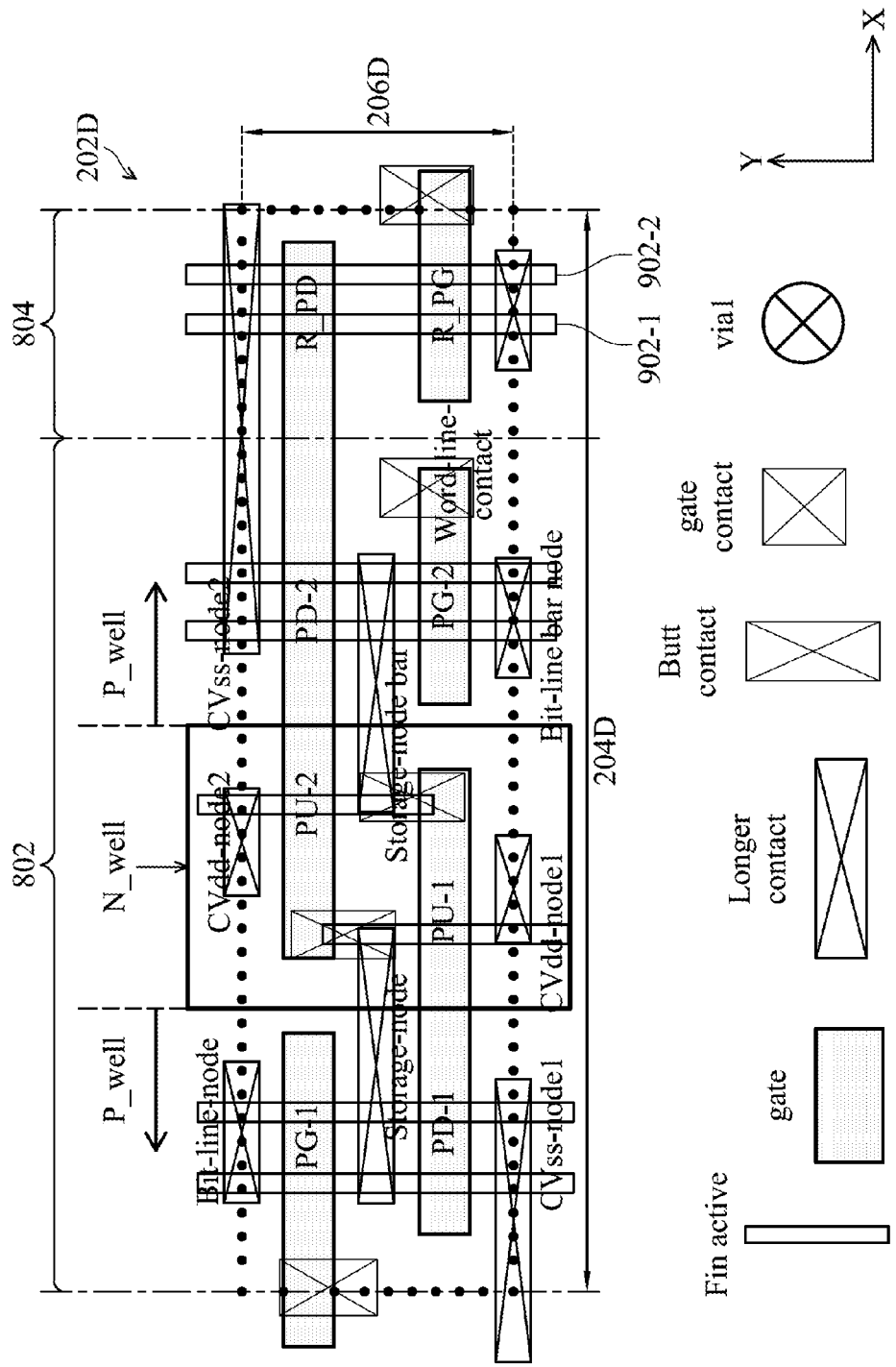
FIG. 9 shows a portion of a layout of the TP SRAM cell of FIG. 8, in accordance with an embodiment.

In practice, the SRAM cell 202D of FIG. 8 can be implemented physically (e.g., layout) in many ways. FIG. 9 shows a top view of a portion of the SRAM cell 202D's layout, in accordance with an embodiment. Referring to FIG. 9, the layout of the write-port portion 802 is substantially the same as that of the SRAM cell 202B (FIG. 6), while the layout of the read-port portion 804 includes the transistors R_PD and R_PG, each as a dual-fin FinFET. Two fin active lines 902-1 and 902-2 are spaced edge-to-edge by one fin pitch 214. Many aspects of the SRAM cells 202D are similar to those discussed above with respect to FIGS. 5-7, and are hereby omitted from discussion for brevity. In an embodiment, to improve manufacturability and circuit density of the SRAM macro 102 having the SRAM cells 202D, the Y-pitch 206D is set to about twice of the gate pitch 216, while the X-pitch 204D is an integer multiple, e.g., 15 times, of the fin pitch 214.

Figure 10A:
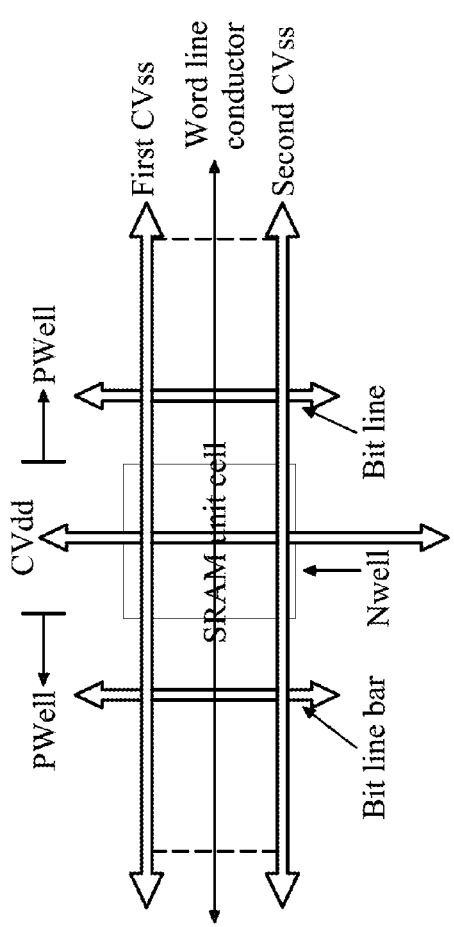
FIGS. 10A and 10B illustrate metal layer routing of embedded SRAM designs, according to various aspects of the present disclosure.
Figure 10B:
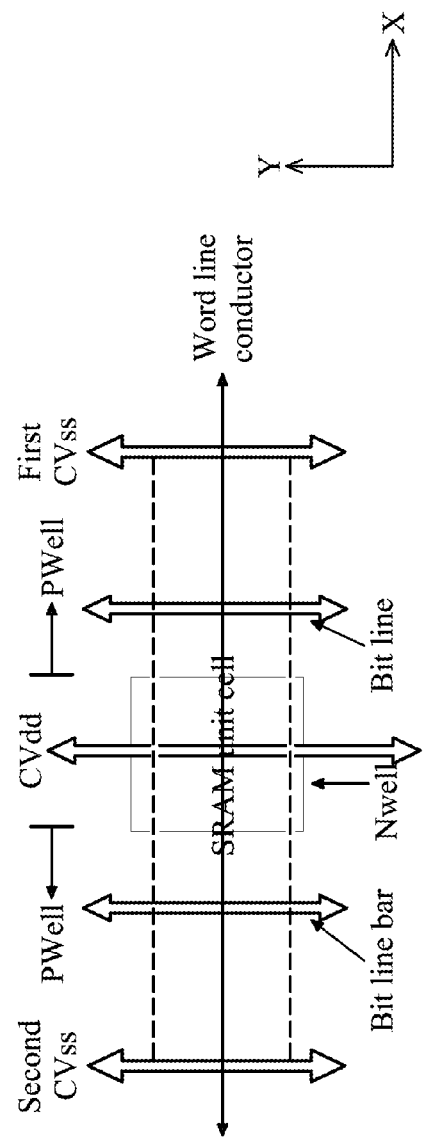

FIGS. 10A and 10B show metal routing of the SRAM cells thus far discussed, in accordance with some embodiments. FIG. 10A shows that the power supply lines (CVdd), bit lines ($\overline{BL}$), and bit bar lines (BL) are routed in a first metal layer, while the word lines (WL) and the ground lines (Vss) are routed in a second metal layer. FIG. 10B shows that the word lines (WL) are routed in the first metal layer; and the power supply lines (CVdd), bit lines (BL), bit bar lines ($\overline{BL}$), and the ground lines (Vss) are routed in the second metal layer. In an embodiment, the first metal layer is located in between the second metal layer and the active regions of the respective SRAM cells. In an embodiment, the first and second metal layers are coupled through inter-layer vias.

Figure 11:
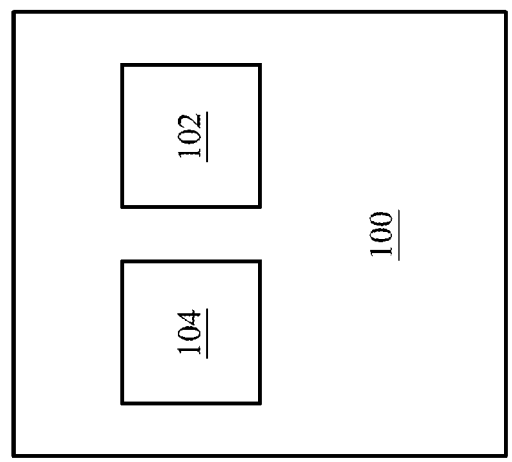
FIG. 11 is a simplified block diagram of an integrated circuit (IC) with embedded SRAM cells, according to various aspects of the present disclosure.

In some applications, a semiconductor device may include more than one SRAM macros. Careful considerations must be taken to ensure manufacturability and circuit density of each of the SRAM macros as well as that at the device level. The present disclosure is well adapted to solving such a problem. FIG. 11 shows that the semiconductor device 100 includes another SRAM macro 104 in addition to the SRAM macro 102. Although they are shown side by side in FIG. 11, in practice, the two SRAM macros may be placed anywhere in the semiconductor device 100. Furthermore, the two SRAM macros 102 and 104 may include the same or different types of SRAM cells. For example, the SRAM macro 102 includes an array of the SRAM cells 202A, while the SRAM macro 104 includes an array of the SRAM cells 202A, 202B, 202C, or 202D. Following are some embodiments of the semiconductor 100 wherein various dimensions of the SRAM macros and the peripheral logic circuits are designed so as to improve full-chip layout automation, fin active line critical dimension uniformity, and overall device manufacturability.

In an embodiment, the SRAM macro 102 includes an array of the SRAM cells 202A (FIG. 5) while the SRAM macro 104 includes an array of the SRAM cells 202B (FIG. 6). The X-pitch 204B is set to be about equal to the X-pitch 204A plus twice of the fin pitch 214 (FIG. 3). In an embodiment, the X-pitch 204A is set to be about 8 times of the fin pitch 214 and the X-pitch 204B is set to be about 10 times of the fin pitch 214. In another embodiment, the X-pitch 204A is set to be about 8.5 times of the fin pitch 214 and the X-pitch 204B is set to be about 10.5 times of the fin pitch 214. In yet another embodiment, the X-pitch 204A is set to be about 9 times of the fin pitch 214 and the X-pitch 204B is set to be about 11 times of the fin pitch 214. Both the Y-pitch 206A and the Y-pitch 206B are set to be about twice of the gate pitch 216. Furthermore, the ratio of the X-pitch 204B to the Y-pitch 206B is in a range of about 2.7 to about 2.9, such as 2.8; and the ratio of the X-pitch 204A to the Y-pitch 206A is in a range of about 2.25 to about 2.28, such as 2.2667.

In an embodiment, the SRAM macro 102 includes an array of the SRAM cells 202B (FIG. 6) while the SRAM macro 104 includes an array of the SRAM cells 202D (FIG. 8). The X-pitch 204B is set to be about 10.5 times of the fin pitch 214 (FIG. 3) and the X-pitch 204D is set to be about 15 times of the fin pitch 214. Both the Y-pitch 206B and the Y-pitch 206D are set to be about twice of the gate pitch 216.

In an embodiment, the SRAM macro 102 includes an array of the SRAM cells 202B (FIG. 6) while the SRAM macro 104 includes an array of the SRAM cells 202C (FIG. 7). The X-pitch 204C is set to be about the X-pitch 204B plus twice of the fin pitch 214 (FIG. 3). For example, the X-pitch 204B is set to be about 10 times of the fin pitch 214 and the X-pitch 204C is set to be about 12 times of the fin pitch 214. For another example, the X-pitch 204B is set to be about 10.5 times of the fin pitch 214 and the X-pitch 204C is set to be about 12.5 times of the fin pitch 214.

Figure 12A:
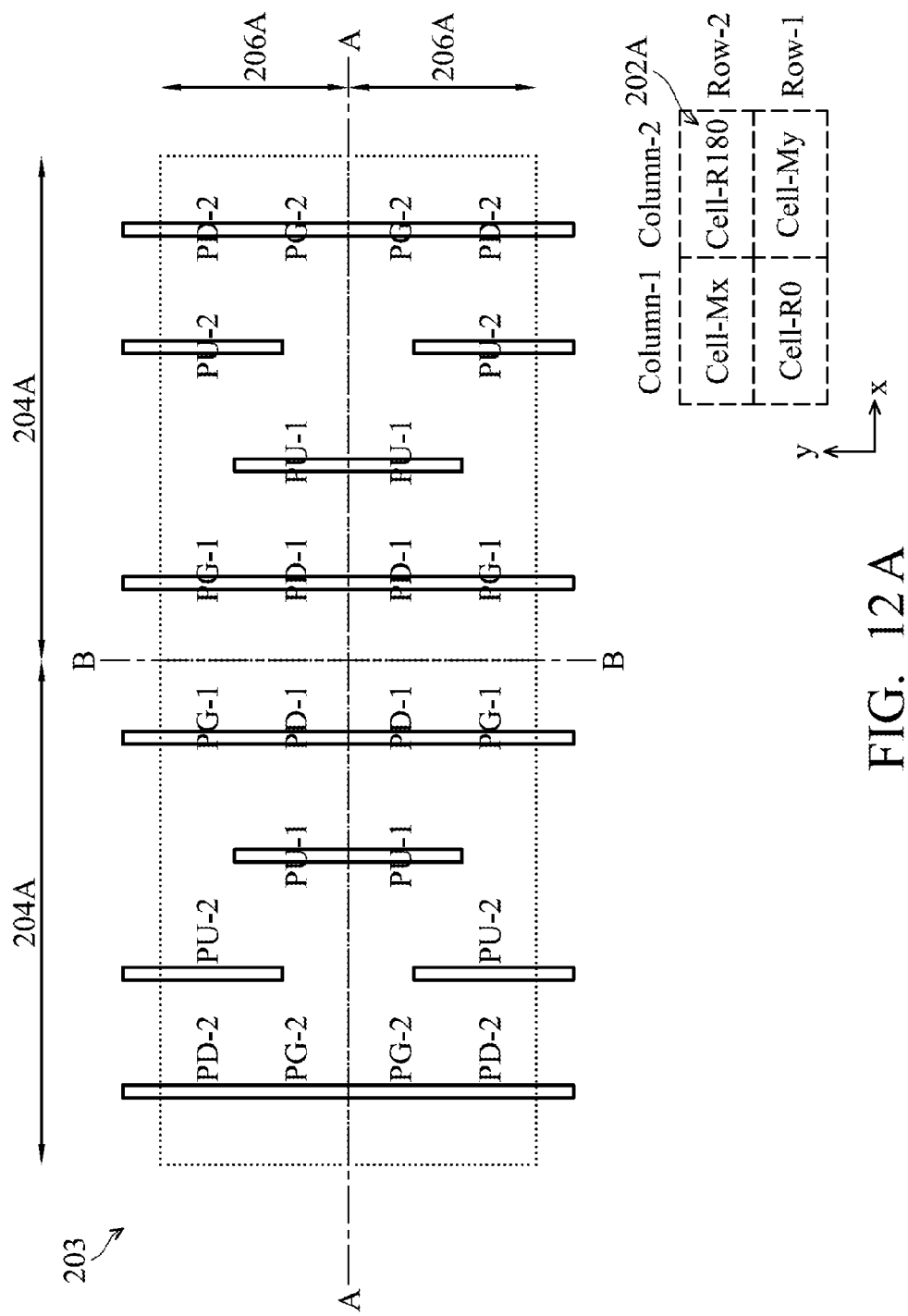
FIG. 12A illustrates a layout of fin active lines of four SRAM cells, according to various aspects of the present disclosure.

FIG. 12A shows fin active lines of the group 203 (FIG. 2) that includes four adjacent SRAM cells 202A (FIG. 5), Cell-R0, Cell-My, Cell-Mx, and Cell-R180. The four cells are arranged in two rows and two columns. The imaginary line A-A denotes their boundary along the X direction, and the imaginary line B-B denotes their boundary along the Y direction. With respect to fin active line configuration (shape, size, and position of the active lines within a cell), Cell-R0 and Cell-My are mirror images of Cell-Mx and Cell-R180 along the line A-A, while Cell-R0 and Cell-Mx are mirror images of Cell-My and Cell-R180 along the line B-B. In the present disclosure, these fin active lines are formed using spacer lithography with three masks (or reticles), 1202, 1204, and 1206, as shown in FIG. 12B.

Figure 12B:
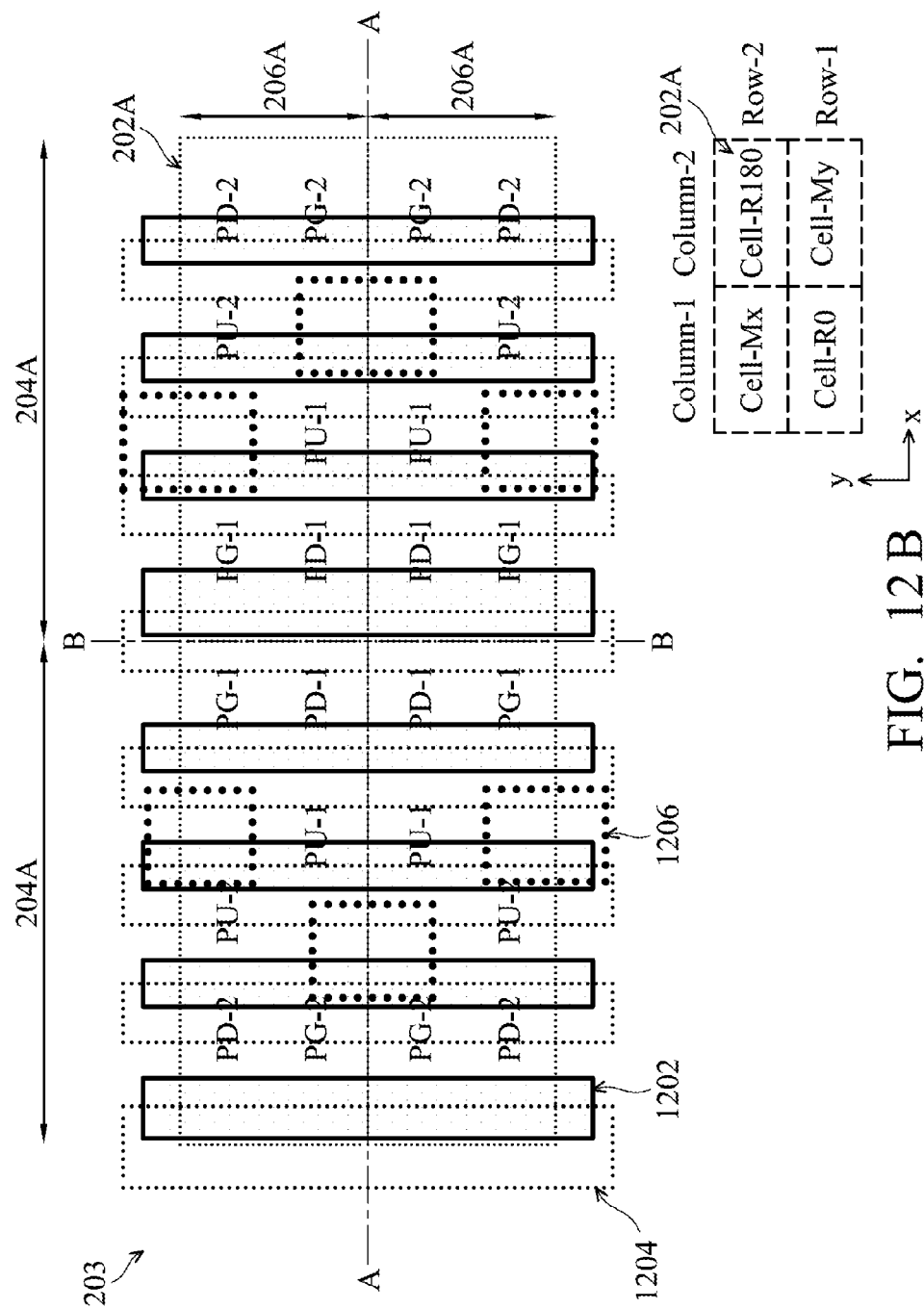
FIG. 12B illustrates a three-layer partition of the fin active line layout of FIG. 12A, in accordance with an embodiment.

Referring to FIG. 12B, the three masks, 1202, 1204, and 1206, are three layers of the design layout of the SRAM macro 102 (and of the semiconductor device 100). The mask 1202 defines mandrel patterns for spacer formation, the mask 1204 defines dummy-fin cut patterns for removing dummy spacers (or dummy fin lines), and the mask 1206 defines fin-end cut patterns, e.g., for shortening fin lines for the pull-up transistors (e.g. PU-1 and PU-2 in FIG. 5). Each mandrel pattern has a rectangular shape (top view) extending lengthwise in the Y direction. In an embodiment, although not shown, each mandrel pattern extends over at least four SRAM cells 202A (see FIG. 2). In an embodiment, there are four mandrel patterns extending over each SRAM cell 202A. With respect to mandrel pattern configuration (shape, size, and position of the mandrel patterns within each cell), Cell-R0 and Cell-My are mirror images of Cell-Mx and Cell-R180 along the line A-A, while Cell-R0 and Cell-Mx are translations of Cell-My and Cell-R180, i.e., shifted by one X-pitch 204A in the X direction. Each dummy-fin cut pattern 1204 is also a rectangular shape (top view) extending lengthwise in the Y direction. The fin-end cut patterns 1206 are located at the boundaries of the SRAM cells in the Y direction for cutting fin lines, e.g., for reducing active areas for the PU-1 and PU-2 transistors. Partitioning the layout of FIG. 12A into three masks of FIG. 12B allows dense and/or regular patterns to be created with each of the masks 1202, 1204 and 1206, which greatly improves pattern critical dimension uniformity during photolithography.

Figure 12C:
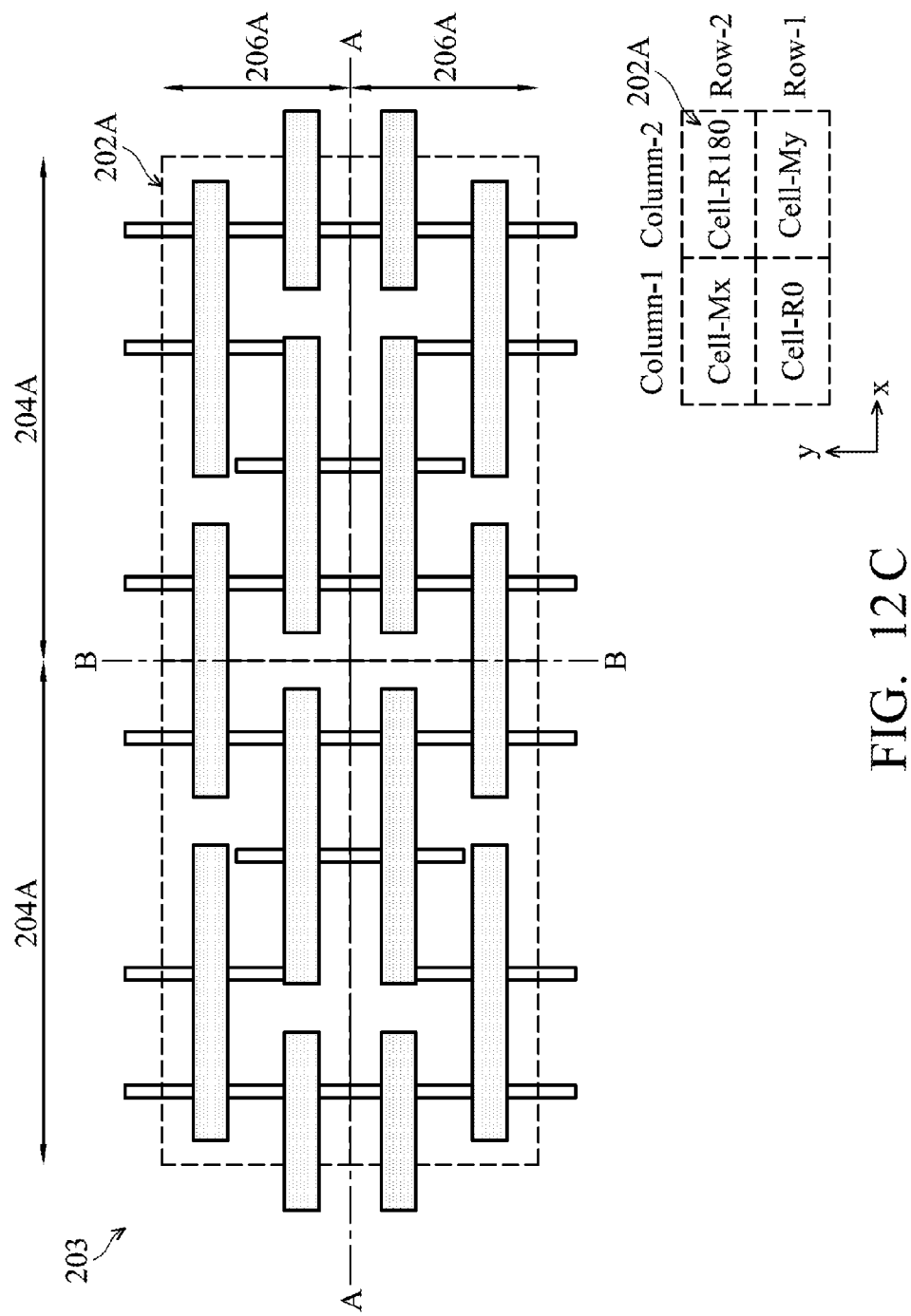
FIG. 12C illustrates gate features of the four SRAM cells of FIG. 12A overlapping with the fin active line thereof, in accordance with an embodiment.

FIG. 12C shows the gate features of the group 203 superimposed onto the fin active lines of the same group. Each gate feature is a rectangular shape extending lengthwise in the X direction. The gate features are spaced in the Y direction having a pitch about half of the Y-pitch 206A. The gate features extend over the fin active lines for forming various P-FinFETs and N-FinFETs. With respect to gate feature configuration (shape, size, and position of gate features within each cell), Cell-R0 and Cell-My are mirror images of Cell-Mx and Cell-R180 along the line A-A, while Cell-R0 and Cell-Mx are mirror images of Cell-My and Cell-R180 along the line B-B.

Figure 13:
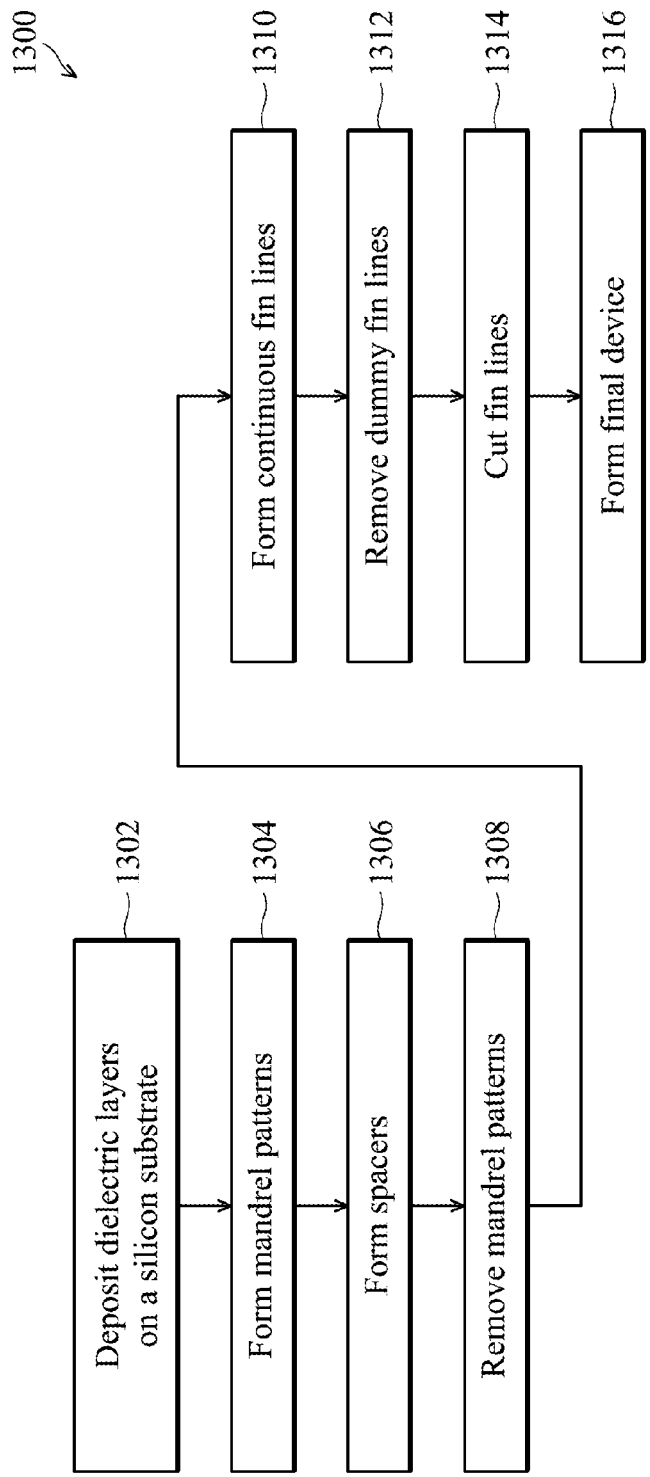
FIG. 13 shows a method of forming an IC with embedded SRAM cells, according to various aspects of the present disclosure.

FIG. 13 shows a method 1300 of forming the fin active lines of the group 203 (FIG. 12A) using the masks 1202, 1204, and 1206 (FIG. 12B), in accordance with an embodiment. Additional operations can be provided before, during, and after the method 1300, and some operations described can be replaced, eliminated, or moved around for additional embodiments of the method. The method 1300 will be described in conjunction with FIGS. 14-24C.

Figure 14:
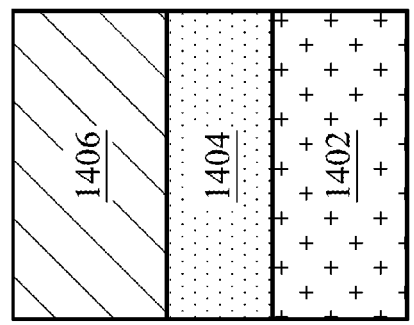

At operation 1302, the method 1300 (FIG. 13) deposits dielectric layers 1404 and 1406 over a silicon substrate 1402 (e.g., semiconductor wafer). Referring to FIG. 14, shown therein is the silicon substrate 1402 with the first dielectric layer 1404 (such as silicon oxide) and the second dielectric layer 1406 (such as silicon nitride) formed thereon. Materials suitable for the dielectric layers 1404 and 1406 include, but not limited to, silicon oxide, silicon nitride, poly-silicon, $Si_3N_4$, SiON, TEOS, nitrogen-containing oxide, nitride oxide, high K material (K>5), or combinations thereof. The dielectric layers 1404 and 1406 are formed by a procedure that includes deposition. For example, the first dielectric layer 1404 of silicon oxide is formed by thermal oxidation. The second dielectric layer 1406 of silicon nitride (SiN) is formed by chemical vapor deposition (CVD). For example, the SiN layer is formed by CVD using chemicals including Hexachlorodisilane (HCD or $Si_2C_{16}$), Dichlorosilane (DCS or $SiH_2C_{12}$), Bis(TertiaryButylAmino) Silane (BTBAS or $C_8H_{22}N_2Si$) and Disilane (DS or $Si_2H_6$). In an embodiment, the dielectric layer 1406 is about 20 nm to about 200 nm thick.

Figures 15A, 15B:
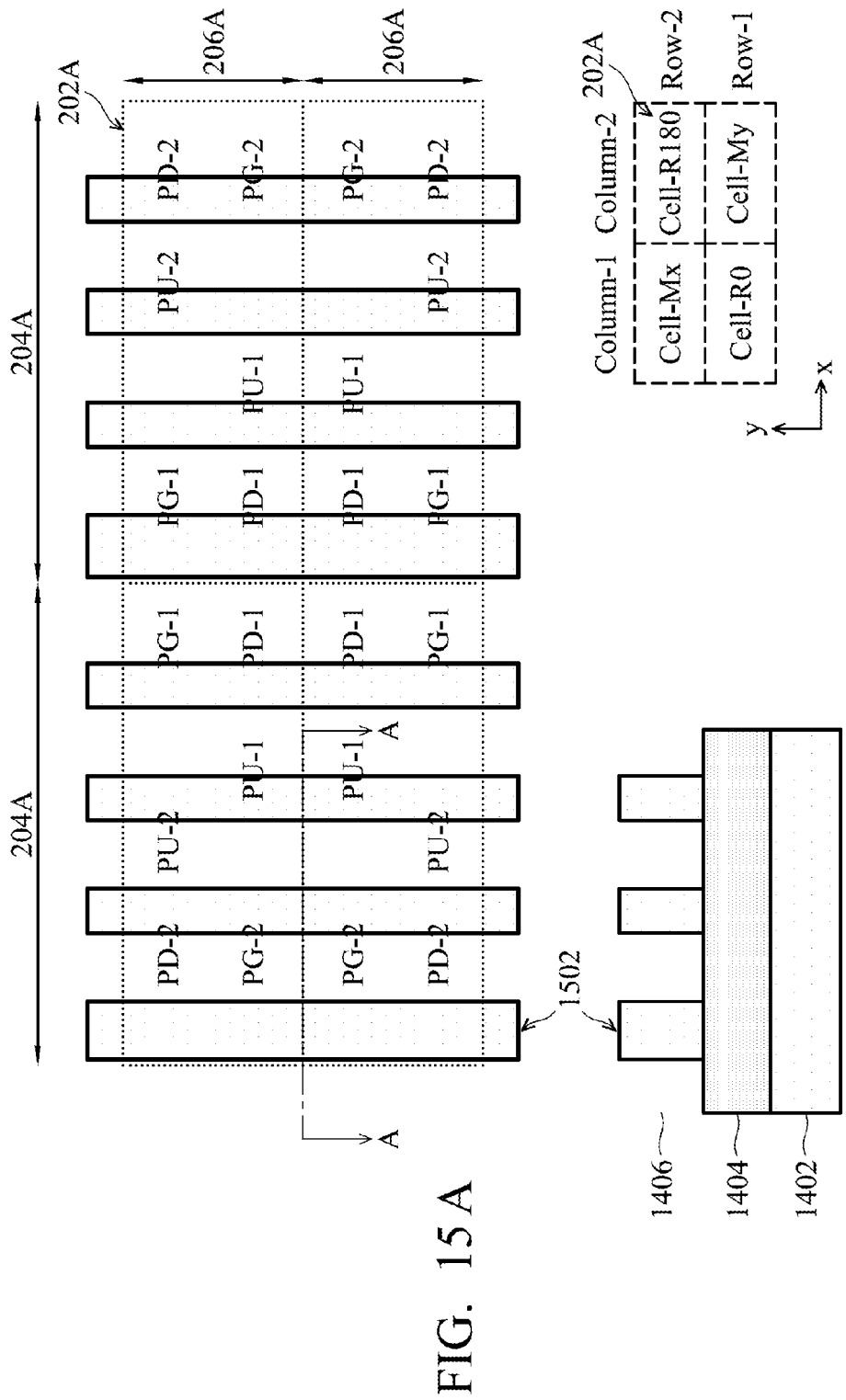

The method 1300 (FIG. 13) proceeds to operation 1304 to form mandrel patterns 1502 in the dielectric layer 1406. Referring to FIG. 15A (top view) and FIG. 15B (cross-sectional view along the A-A lines of FIG. 15A), the mandrel patterns 1502 are evenly distributed in the X direction. The mandrel patterns 1502 are formed by patterning the dielectric layer 1406 with a procedure including a lithography process and an etching process. In the present embodiment, a photoresist layer is formed on the dielectric layer 1406 using a spin-coating process and soft baking process. Then, the photoresist layer is exposed to a radiation using the mask 1202 (FIG. 12B). The exposed photoresist layer is developed using post-exposure baking (PEB), developing, and hard baking thereby forming a patterned photoresist layer over the dielectric layer 1406. Subsequently, the dielectric layer 1406 is etched through the openings of the patterned photoresist layer, forming a patterned dielectric layer 1406. The patterned photoresist layer is removed thereafter using a suitable process, such as wet stripping or plasma ashing. In one example, the etching process includes applying a dry (or plasma) etch to remove the dielectric layer 1406 within the openings of the patterned photoresist layer. In another example, the etching process includes applying a wet etch with a hydrofluoric acid (HF) solution to remove the SiO layer 1406 within the openings. During the above photolithography process, the pattern regularity of the mandrel patterns 1502 helps improve pattern critical dimension uniformity in view of optical proximity effect.

The method 1300 (FIG. 13) proceeds to operation 1306 to form spacers 1602. Referring to FIG. 16A (top view) and FIG. 16B (cross-sectional view along the A-A lines of FIG. 16A), shown therein are the spacers 1602 formed on the sidewalls of the mandrel patterns 1502. The spacers 1602 include one or more material different from the mandrel patterns 1502. In an embodiment, the spacers 1602 may include a dielectric material, such as titanium nitride, silicon nitride, or titanium oxide. Other materials suitable for the spacers 1602 include, but not limited to, poly-silicon, $SiO_2$, $Si_3N_4$, SiON, TEOS, nitrogen-containing oxide, nitride oxide, high K material (K>5), or combinations thereof. The spacers 1602 can be formed by various processes, including a deposition process and an etching process. For example, the deposition process includes a chemical vapor deposition (CVD) process or a physical vapor deposition (PVD) process. For example, the etching process includes an anisotropic etch such as plasma etch.

Figures 17A, 17B:
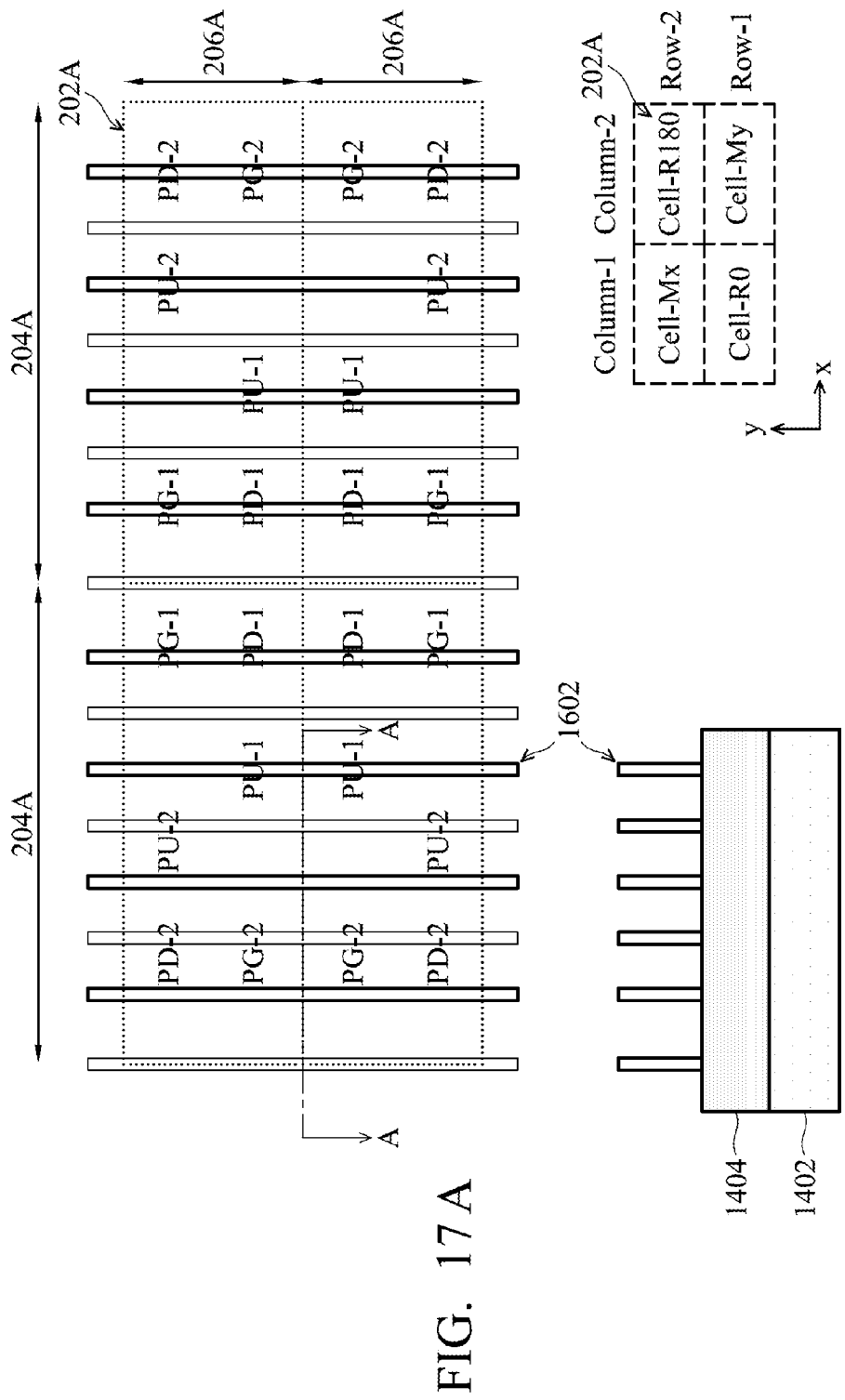

The method 1300 (FIG. 13) proceeds to operation 1308 to remove the mandrel patterns 1502. Referring to FIG. 17A (top view) and FIG. 17B (cross-sectional view along the A-A lines of FIG. 17A), the spacers 1602 remain over the dielectric layer 1404 after the mandrel patterns 1502 have been removed, e.g., by an etching process selectively tuned to remove the dielectric material 1406 but not the spacer material. The etching process can be a wet etching, a dry etching, or a combination thereof.

The method 1300 (FIG. 13) proceeds to operation 1310 to form fin lines 1802 in the silicon substrate 1402. Referring to FIG. 18B which is cross-sectional view along the A-A lines of FIG. 18A, the silicon substrate 1402 are etched with the spacers 1602 as an etch mask. The spacers 1602 and the dielectric layer 1404 are subsequently removed thereby forming the fin lines 1802 in the silicon substrate 1402 (FIG. 18C).

Figures 19A, 19B:
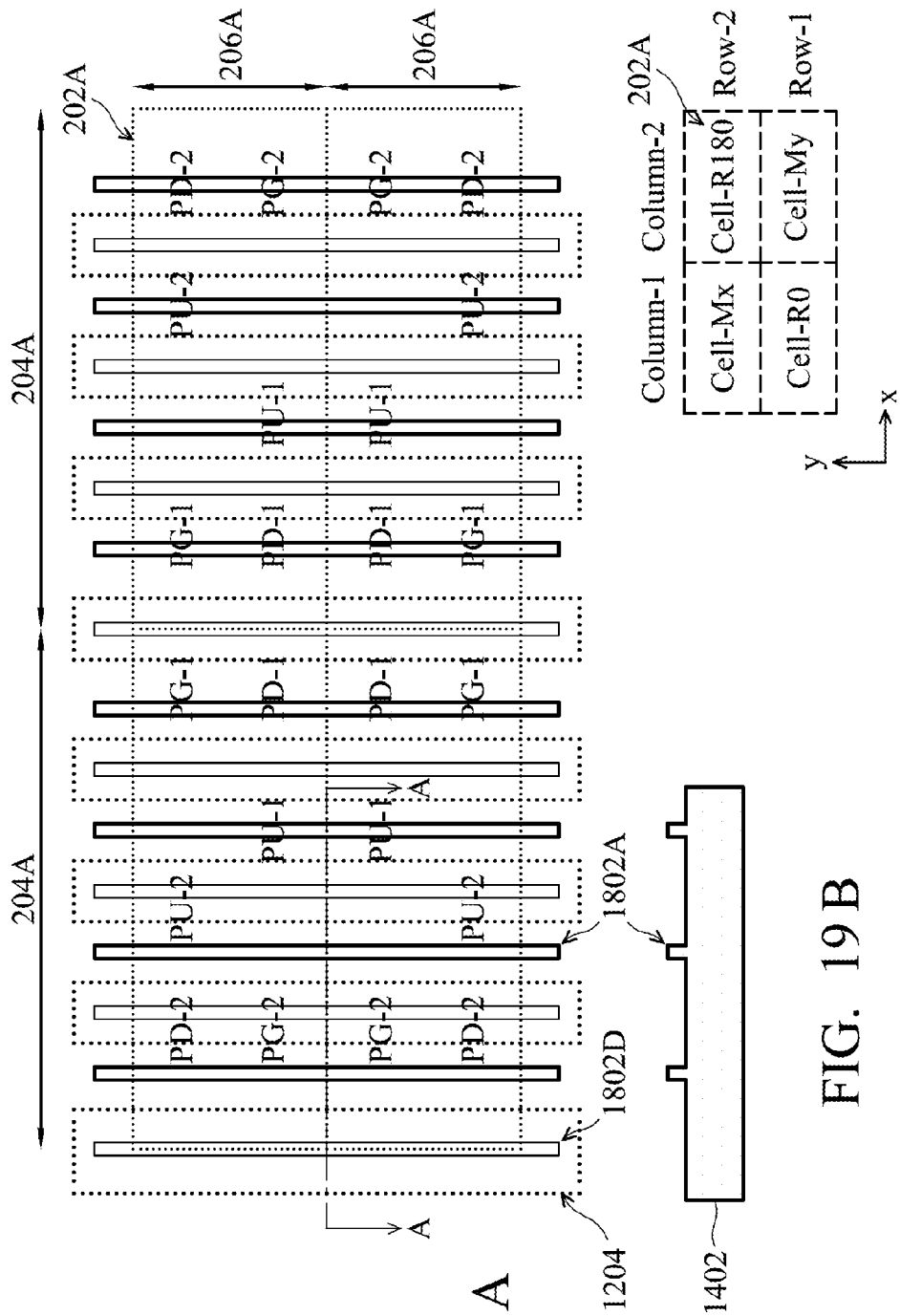

The method 1300 (FIG. 13) proceeds to operation 1312 to perform a first fin cut process with the mask 1204 (FIG. 12B) thereby removing dummy fin lines. Referring to FIG. 19A (top view) and FIG. 19B (cross-sectional view along the A-A lines of FIG. 19A), dummy fin lines 1802D are removed thereby leaving the fin lines 1802A on the silicon substrate 1402. In the present embodiment, the dummy fin lines 1802D are removed by a procedure including a lithography process and an etching process. For example, a photoresist layer is formed on the silicon substrate using a spin-coating process and soft baking process. Then, the photoresist layer is exposed to a radiation using the mask 1204 where the dotted lines of FIG. 19A indicate openings to be formed. The exposed photoresist layer is subsequently developed and stripped thereby forming a patterned photoresist layer. The fin lines 1802A are protected by the patterned photoresist layer while the dummy fin lines 1802D are not protected as such. Subsequently, the dummy fin lines 1802D are etched through the openings of the patterned photoresist layer. The patterned photoresist layer is removed thereafter using a suitable process, such as wet stripping or plasma ashing.

Figures 20A, 20B:
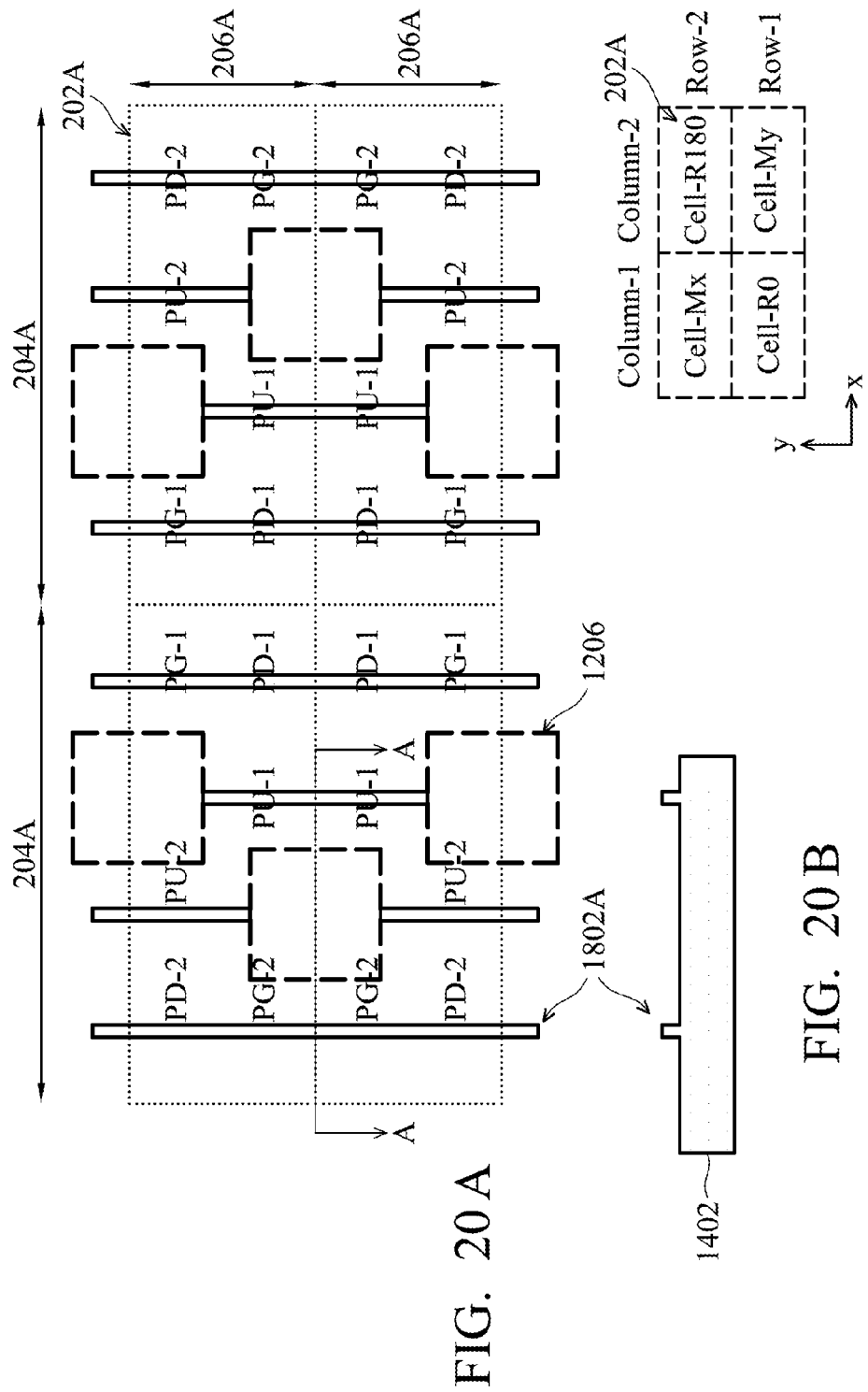

The method 1300 (FIG. 13) proceeds to operation 1314 to perform a second fin cut process with the mask 1206 (FIG. 12B) thereby cutting fin lines for pull-up transistors such as PU-1 and PU-2 of FIG. 5. Referring to FIG. 20A (top view) and FIG. 20B (cross-sectional view along the A-A lines of FIG. 20A), portions of the fin lines 1802A are removed across the boundaries of the SRAM cells 202A thereby forming shortened fin lines for the pull-up transistors PU-1 and PU-2. In the present embodiment, the second fin cut process is similar to the first fin cut process discussed with respect to FIGS. 19A and 19B except that the second fin cut process uses the mask 1206.

The method 1300 (FIG. 13) proceeds to operation 1316 to form a final device with the fin lines 1802A. For example, the operation 1316 may include implanting dopant for well and channel doping, forming gate dielectric, forming lightly doped source/drain, forming gate stacks, and so on.

Figure 21:
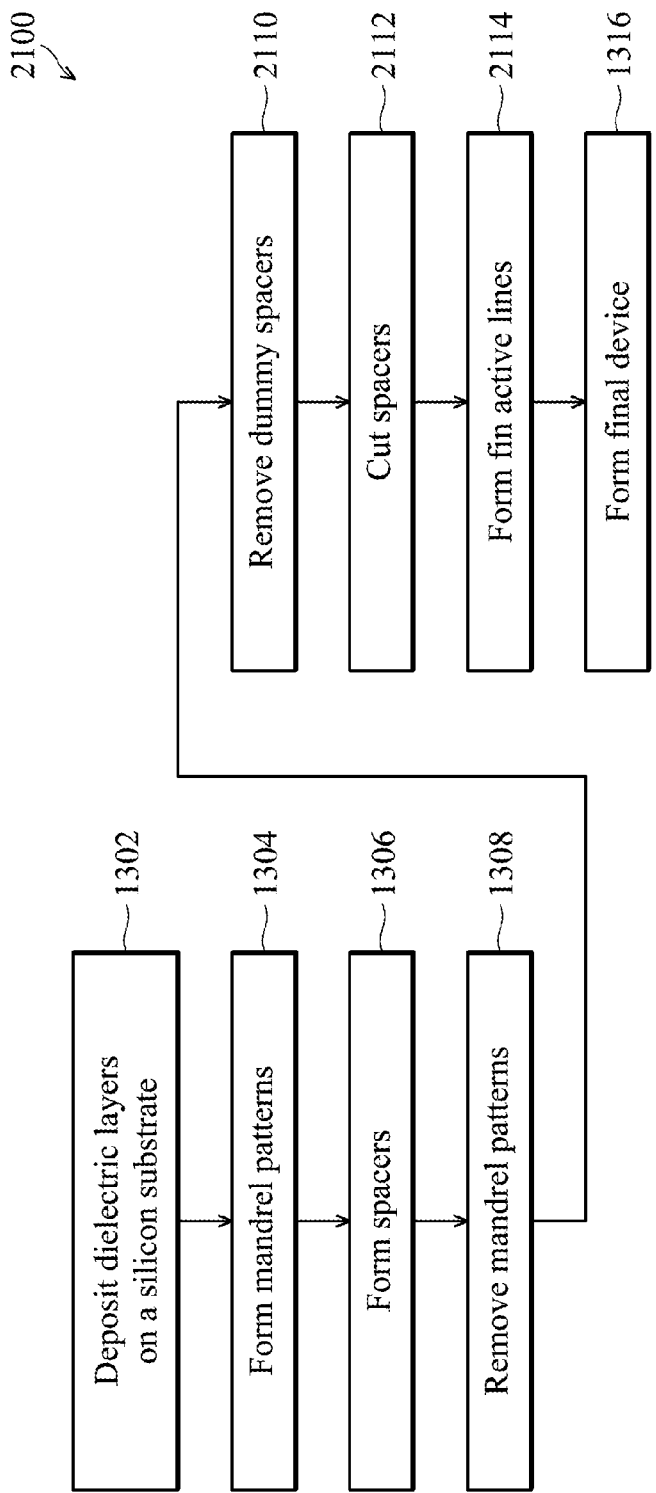
FIG. 21 shows a method of forming an IC with embedded SRAM cells, according to various aspects of the present disclosure.

FIG. 21 shows a method 2100 of forming the fin active lines of the group 203 (FIG. 12A) with the three masks, 1202, 1204, and 1206, of FIG. 12B, in accordance with an embodiment. Additional operations can be provided before, during, and after the method 2100, and some operations described can be replaced, eliminated, or moved around for additional embodiments of the method. Some operations of the method 2100 are the same or similar to those respective operations of the method 1300, and are hereby omitted from discussion for brevity.

After operation 1308, the method 2100 (FIG. 21) has formed spacers 1602A and 1602D (FIGS. 22A and 22B) where the spacers 1602A will be used for forming fin active lines while the spacers 1602D (dummy spacers) will not.

At operation 2110, the method 2100 (FIG. 21) removes the dummy spacers 1602D with the aid of the mask 1204, e.g., by a photolithography process and an etching process as discussed above with reference to FIGS. 19A and 19B, wherein the etching process is selectively tuned to remove the spacer material (FIG. 22C).

At operation 2112, the method 2100 (FIG. 21) cuts the spacers 1602A across the boundaries of the SRAM cells 202A with the aid of the mask 1206 (FIGS. 23A and 23B). This can be done with a process similar to the photolithography process and the etching process as discussed above with reference to FIGS. 20A and 20B, wherein the etching process is selectively tuned to remove the spacer material (FIG. 23B).

At operation 2114, the method 2100 (FIG. 21) etches the silicon substrate 1402 with the remaining spacers 1602A as an etch mask (FIGS. 24A and 24B). The spacers 1602A and the dielectric layer 1404 are subsequently removed thereby forming fin lines 1802A in the silicon substrate 1402 for the transistors PU-1/2, PD-1/2, and PG-1/2 (FIG. 24C).

The method 2100 (FIG. 21) proceeds to operation 1316 to form a final device with the fin lines 1802A as discussed above.

Figure 25A:
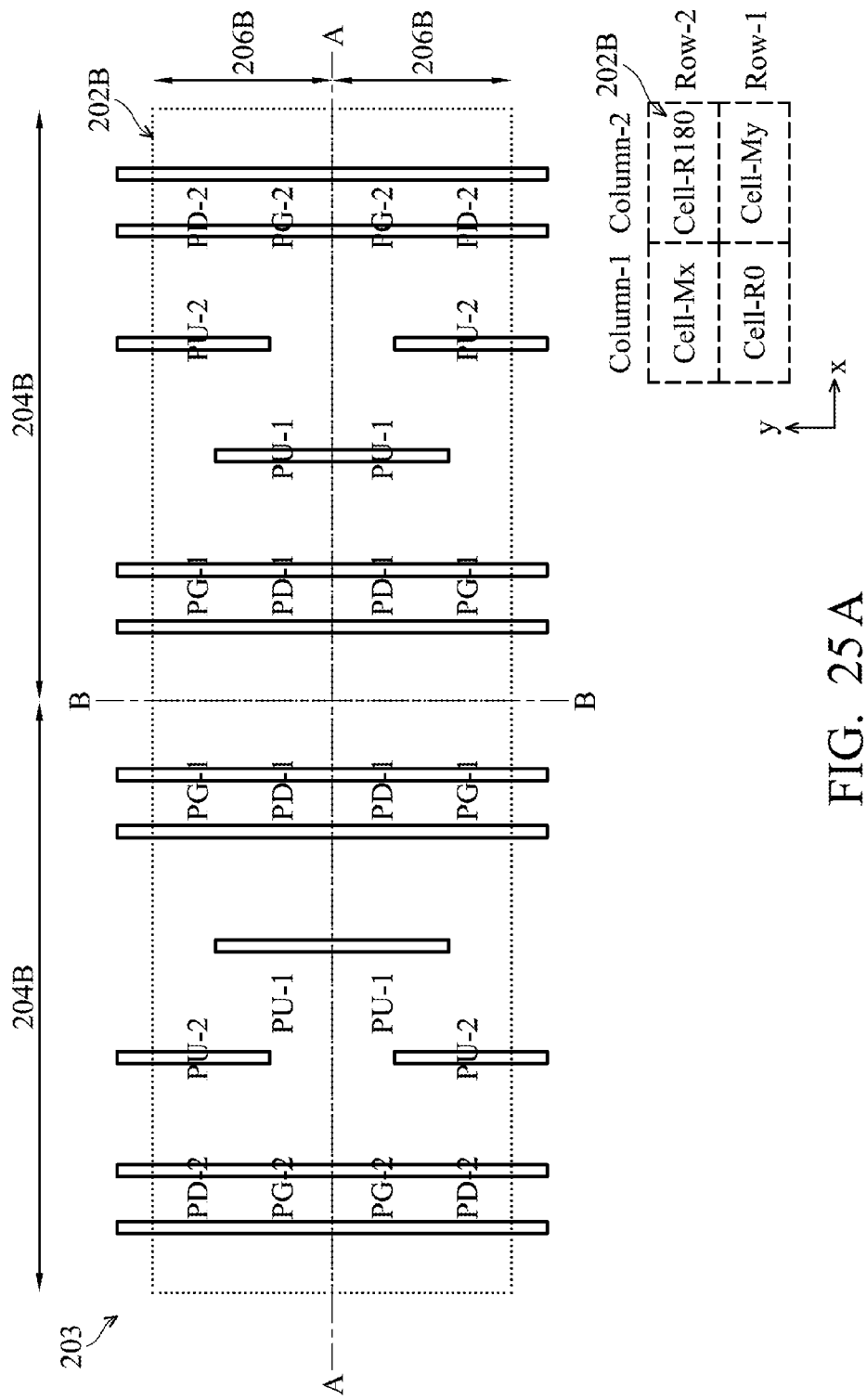
FIG. 25A illustrates a layout of fin active lines of four SRAM cells, according to various aspects of the present disclosure.
Figure 25:
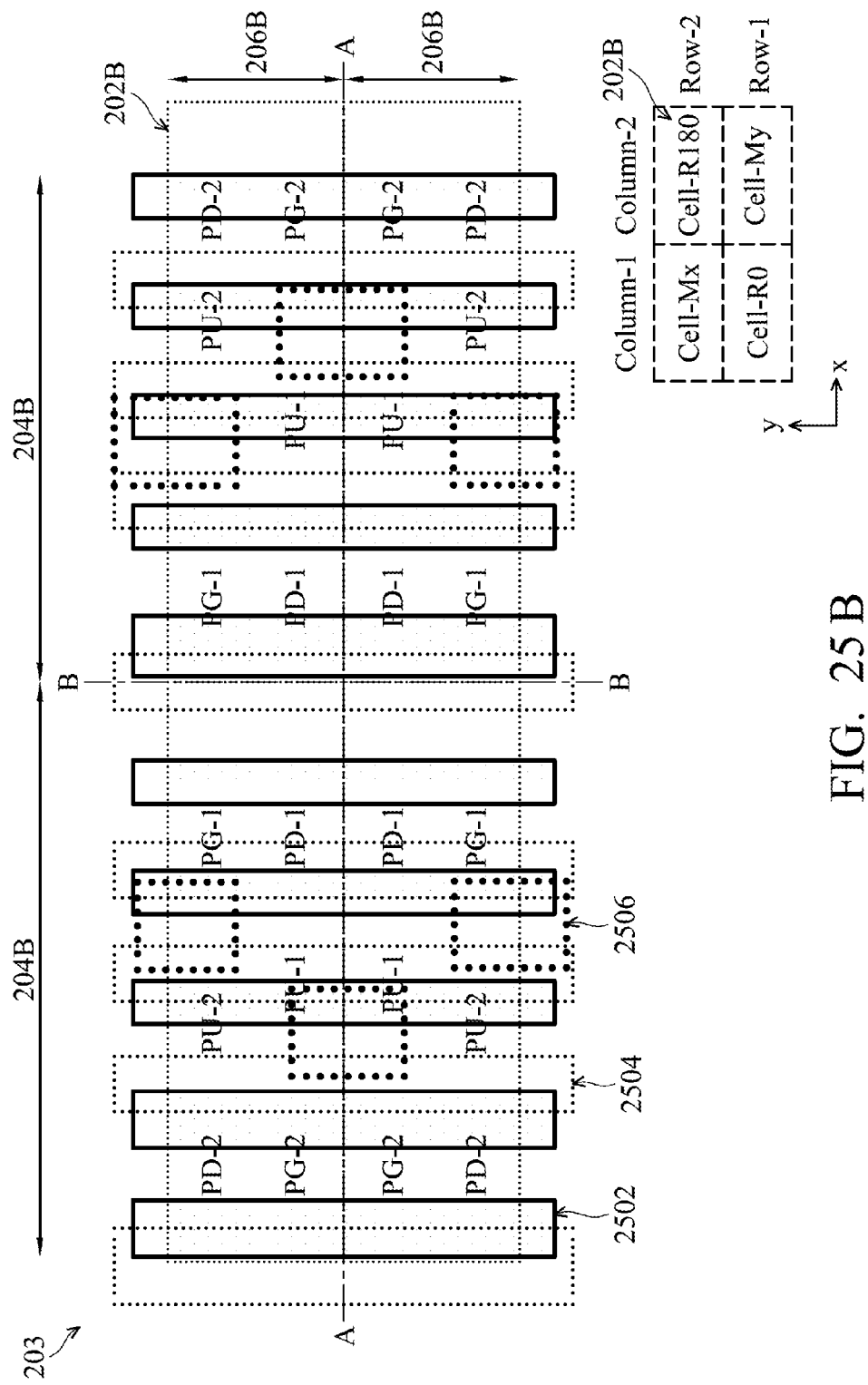
FIG. 25B illustrates a three-layer partition of the fin active line layout of FIG. 25A, in accordance with an embodiment.
FIG. 25C illustrates gate features of the four SRAM cells of FIG. 25A overlapping with the fin active line thereof, in accordance with an embodiment.
Figure 25:
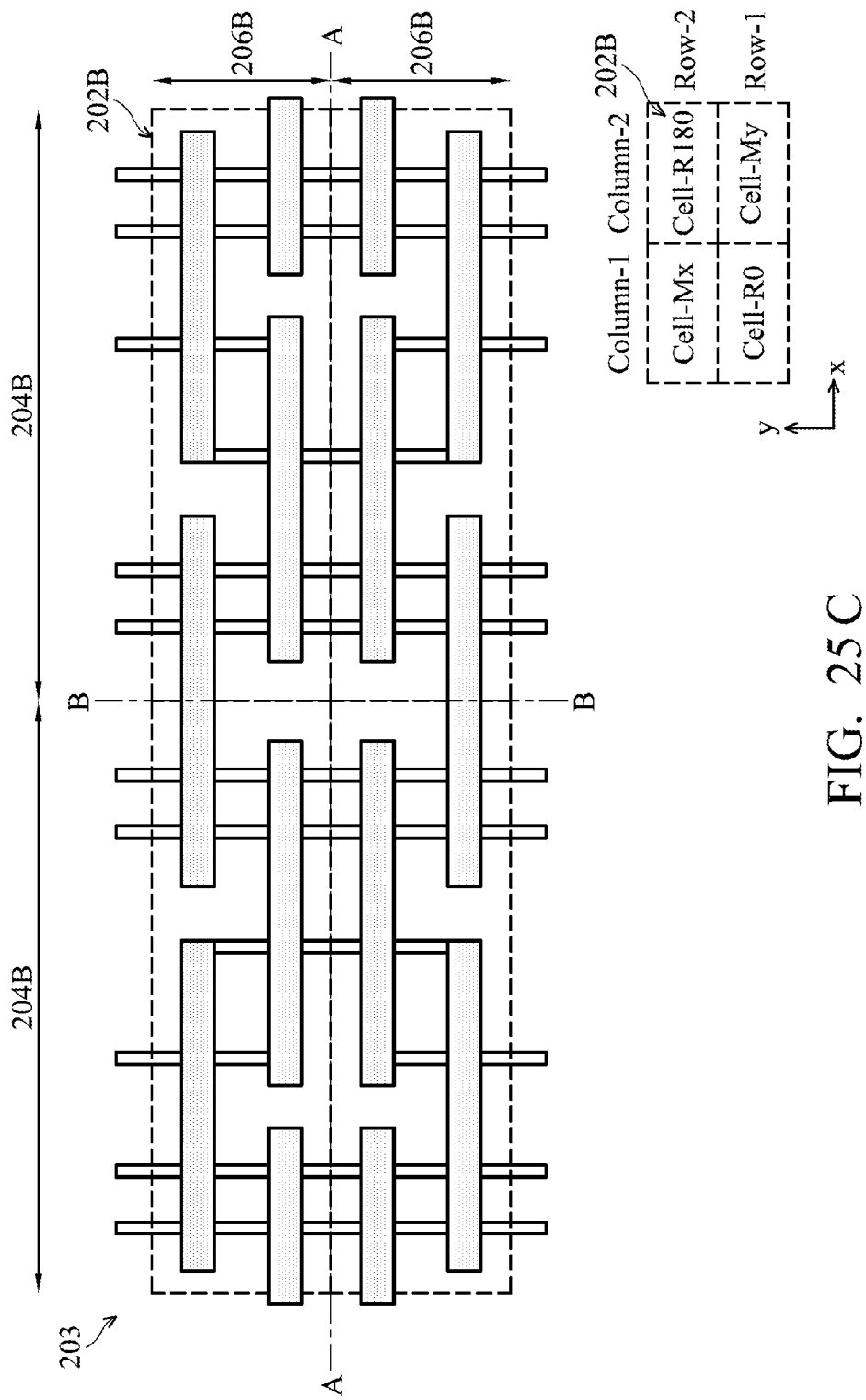

FIG. 25A shows fin active lines of the group 203 (FIG. 2) that includes four adjacent SRAM cells 202B (FIG. 6), Cell-R0, Cell-My, Cell-Mx, and Cell-R180. The four cells are arranged in two rows and two columns. The imaginary line A-A denotes their boundary along the X direction, and the imaginary line B-B denotes their boundary along the Y direction. With respect to fin active line configuration (shape, size, and position of the active lines within a cell), Cell-R0 and Cell-My are mirror images of Cell-Mx and Cell-R180 along the line A-A, while Cell-R0 and Cell-Mx are mirror images of Cell-My and Cell-R180 along the line B-B. In the present disclosure, these fin active lines are formed using spacer lithography with three masks, 2502, 2504, and 2506, as shown in FIG. 25B.

Referring to FIG. 25B, similar to the three masks 1202, 1204, and 1206 in FIG. 12B, the three masks 2502, 2504, and 2506 are three layers of the design layout of the SRAM macro 102 (and of the semiconductor device 100). The mask 2502 defines mandrel patterns for spacer formation, the mask 2504 defines dummy-fin cut patterns for removing dummy fin lines (or dummy spacers), and the mask 2506 defines fin-end cut patterns for shortening fin lines for the pull-up transistors (e.g. PU-1 and PU-2 in FIG. 5). As shown in FIG. 25B, the mandrel patterns are evenly distributed in the X direction. Each mandrel pattern has a rectangular shape (top view) extending lengthwise in the Y direction. In an embodiment, although not shown, each mandrel pattern extends over at least four SRAM cells 202B (see FIG. 2). In the present embodiment, the layout includes five mandrel patterns extending over each SRAM cell 202B. With respect to mandrel pattern configuration (shape, size, and position of the mandrel patterns within each cell), Cell-R0 and Cell-My are mirror images of Cell-Mx and Cell-R180 along the line A-A, while Cell-R0 and Cell-Mx are translations of Cell-My and Cell-R180, i.e., shifted by one X-pitch 204B in the X direction. Each dummy-fin cut pattern is also a rectangular shape (top view) extending lengthwise in the Y direction. The fin-end cut patterns are located at the boundaries of the SRAM cells 202B in the Y direction and are used for cutting fin lines, e.g., for reducing active areas for the PU-1 and PU-2 transistors. Partitioning the layout of FIG. 25A into three masks of FIG. 25B allows dense and/or regular patterns to be created with the masks, which improves pattern critical dimension uniformity during photolithography. The fin active lines of FIG. 25A can be formed with the masks of FIG. 25B using an embodiment of the method 1300 (FIG. 13) or the method 2100 (FIG. 21) as discussed above.

FIG. 25C shows the gate features of the group 203 superimposed onto the fin active lines of the same group (FIG. 25A). Each gate feature is a rectangular shape extending lengthwise in the X direction. The gate features are spaced in the Y direction having a pitch about half of the Y-pitch 206B. The gate features extend over the fin active lines for forming various P-FinFETs and N-FinFETs. With respect to gate feature configuration (shape, size, and position of gate features within each cell), Cell-R0 and Cell-My are mirror images of Cell-Mx and Cell-R180 along the line A-A, while Cell-R0 and Cell-Mx are mirror images of Cell-My and Cell-R180 along the line B-B.

Although not intended to be limiting, the present disclosure provides many benefits. For example, the present disclosure defines an embedded FinFET SRAM macro structure which enables alignment of respective features (e.g., fin active lines, gate features, etc.) between SRAM cells and peripheral logic circuits. Such alignment enables dense fin active lines formation and single fin pitch design, as an example. The embedded FinFET SRAM macro structure is flexible in that it may include high density SRAM cells, high current SRAM cells, single port SRAM cells, two-port SRAM cells, or a combination thereof. Therefore, it can be deployed in a wide range of applications, such as computing, communication, mobile phones, and automotive electronics. The present disclosure further teaches layout designs of the fin active regions for some embodiments of the SRAM cells, as well as methods for making the same. In some embodiments, the fin active region layout is partitioned into a mandrel pattern layer (mask) and two cut pattern layers (masks). The mandrel patterns are dense, parallel, and rectangular shapes, enhancing critical dimension uniformity during photolithography process.

In one exemplary aspect, the present disclosure is directed to an integrated circuit (IC) layout. The IC layout includes a first rectangular region, wherein the first rectangular region has its longer sides in a first direction and its shorter sides in a second direction that is orthogonal to the first direction; and a first imaginary line through a geometric center of the first rectangular region in the first direction and a second imaginary line through the geometric center in the second direction divide the first rectangular region into a first, second, third, and fourth sub-regions in counter-clockwise order with the first sub-region located at an upper-right portion of the first rectangular region. The IC layout further includes at least eight first patterns located at a first layer of the IC layout, wherein each of the first patterns is a rectangular shape extending lengthwise in the second direction over the first rectangular region; the first patterns are spaced from each other in the first direction; a first, second, third, and fourth portions of the first patterns overlap with the first, second, third, and fourth sub-regions respectively; the first and second portions of the first patterns are mirror images of the respective fourth and third portions of the first patterns with respect to the first imaginary line; and the first and fourth portions of the first patterns are translations of the respective second and third portions of the first patterns. The IC layout further includes at least eight second patterns located at a second layer of the IC layout, wherein each of the second patterns is a rectangular shape extending lengthwise in the second direction, the second patterns are spaced from each other in the first direction, each of the second patterns partially overlaps with one of the first patterns and fully covers a longer side of the respective first pattern when the first and second layers are superimposed. The IC layout further includes a plurality of third patterns located at a third layer of the IC layout, wherein each of the third patterns is a rectangular shape, the third patterns are spaced from each other, each of the third patterns partially overlaps with one of the first patterns and covers a portion of a longer side of the respective first pattern that is not covered by the second patterns when the first, second, and third layers are superimposed. In the above IC layout, the first, second, and third patterns are used for collectively defining a plurality of active regions for forming transistors; and the plurality of active regions are defined along longer sides of the first patterns that are not covered by the second and third patterns when the first, second, and third layers are superimposed.

In another exemplary aspect, the present disclosure is directed to a semiconductor device. The semiconductor device includes a first SRAM macro, wherein the first SRAM macro includes a first plurality of single-port SRAM cells and a second plurality of peripheral logic circuits, the first plurality are arranged to have a first pitch in a first direction and a second pitch in a second direction orthogonal to the first direction, the first plurality include FinFET transistors formed by first gate features and first fin active lines, the second plurality include FinFET transistors formed by second gate features and second fin active lines, the second gate features are arranged to have a third pitch in the second direction, and the second fin active lines are arranged to have a fourth pitch in the first direction. The semiconductor device further includes a second SRAM macro, wherein the second SRAM macro includes a third plurality of single-port SRAM cells and a fourth plurality of peripheral logic circuits, the third plurality are arranged to have a fifth pitch in the first direction and a sixth pitch in the second direction, the third plurality include FinFET transistors formed by third gate features and third fin active lines, the fourth plurality include FinFET transistors formed by fourth gate features and fourth fin active lines, the fourth gate features are arranged to have the third pitch in the second direction, and the fourth fin active lines are arranged to have the fourth pitch in the first direction. In the semiconductor device above, the second pitch is about twice of the third pitch; the sixth pitch is about the same as the second pitch; and the fifth pitch is greater than the first pitch by about twice of the fourth pitch.

In another exemplary aspect, the present disclosure is directed to a semiconductor device. The semiconductor device includes a first SRAM macro, wherein the first SRAM macro includes a first plurality of single-port SRAM cells and a second plurality of peripheral logic circuits, the first plurality are arranged to have a first pitch in a first direction and a second pitch in a second direction orthogonal to the first direction, the first plurality include first FinFET transistors formed by first gate features and first fin active lines, the second plurality include second FinFET transistors formed by second gate features and second fin active lines, the second gate features are arranged to have a third pitch in the second direction, and the second fin active lines are arranged to have a fourth pitch in the first direction. The semiconductor device further includes a second SRAM macro, wherein the second SRAM macro includes a third plurality of two-port SRAM cells and a fourth plurality of peripheral logic circuits, the third plurality are arranged to have a fifth pitch in the first direction and a sixth pitch in the second direction, the third plurality include third FinFET transistors formed by third gate features and third fin active lines, the fourth plurality include fourth FinFET transistors formed by fourth gate features and fourth fin active lines, the fourth gate features are arranged to have the third pitch in the second direction, and the fourth fin active lines are arranged to have the fourth pitch in the first direction. In the semiconductor device above, the second pitch is about twice of the third pitch; the sixth pitch is about the same as the second pitch; a first ratio between the first pitch and the fourth pitch is not an integer; and a second ratio between the fifth pitch and the fourth pitch is an integer.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) layout, comprising:
   a first rectangular region, wherein the first rectangular region has its longer sides in a first direction and its shorter sides in a second direction that is orthogonal to the first direction; and a first imaginary line through a geometric center of the first rectangular region in the first direction and a second imaginary line through the geometric center in the second direction divide the first rectangular region into a first, second, third, and fourth sub-regions in counter-clockwise order with the first sub-region located at an upper-right portion of the first rectangular region;
   at least eight first patterns located at a first layer of the IC layout, wherein each of the first patterns is a rectangular shape extending lengthwise in the second direction over the first rectangular region; the first patterns are spaced from each other in the first direction; a first, second, third, and fourth portions of the first patterns overlap with the first, second, third, and fourth sub-regions respectively; the first and second portions of the first patterns are mirror images of the respective fourth and third portions of the first patterns with respect to the first imaginary line; and the first and fourth portions of the first patterns are translations of the respective second and third portions of the first patterns;
   at least eight second patterns located at a second layer of the IC layout, wherein each of the second patterns is a rectangular shape extending lengthwise in the second direction, the second patterns are spaced from each other in the first direction, each of the second patterns partially overlaps with one of the first patterns and fully covers a longer side of the respective first pattern when the first and second layers are superimposed; and
   a plurality of third patterns located at a third layer of the IC layout, wherein each of the third patterns is a rectangular shape, the third patterns are spaced from each other, each of the third patterns partially overlaps with one of the first patterns and covers a portion of a longer side of the respective first pattern that is not covered by the second patterns when the first, second, and third layers are superimposed,
   wherein:
   the first, second, and third patterns are used for collectively defining a plurality of active regions for forming transistors; and
   the plurality of active regions are defined along longer sides of the first patterns that are not covered by the second and third patterns when the first, second, and third layers are superimposed.

2. The IC layout of claim 1, wherein the active regions are fin active lines for forming FinFET type of transistors.

3. The IC layout of claim 1, further comprising:
   a plurality of gate features located at a gate layer of the IC layout,
   wherein each of the gate features is a rectangular shape extending lengthwise in the first direction; the gate features are spaced from each other in the second direction by a gate pitch; a first, second, third, and fourth portions of the gate features overlap with the first, second, third, and fourth sub-regions respectively; the first and second portions of the gate features are mirror images of the respective fourth and third portions of the gate features with respect to the first imaginary line; the first and fourth portions of the gate features are mirror images of the respective second and third portions of the gate features with respect to the second imaginary line; some of the gate features are used for forming P-transistors with respective ones of the active regions; and some of the gate features are used for forming N-transistors with respective ones of the active regions.

4. The IC layout of claim 3, wherein the gate features and the active regions are to form at least six transistors in each of the sub-regions and the at least six transistors in each of the sub-regions are to form a SRAM cell.

5. The IC layout of claim 4, wherein the at least six transistors in each of the sub-regions are FinFET transistors.

6. The IC layout of claim 1, further comprising a second rectangular region that is substantially the same as the first rectangular region and is located side-by-side with the first rectangular region extending in the second direction, wherein the first and second patterns extend over at least the first and second rectangular regions.

7. The IC layout of claim 1, wherein there are eight first patterns extending over the first rectangular region, and each of the eight first patterns overlaps with one of the second patterns when the first and second layers are superimposed.

8. The IC layout of claim 1, wherein there are ten first patterns extending over the first rectangular region, and two of the ten first patterns do not overlap with any one of the second patterns when the first and second layers are superimposed.

9. A semiconductor device comprising:
a first SRAM macro, wherein the first SRAM macro includes a first plurality of single-port SRAM cells and a second plurality of peripheral logic circuits, the first plurality are arranged to have a first pitch in a first direction and a second pitch in a second direction orthogonal to the first direction, the first plurality include FinFET transistors formed by first gate features and first fin active lines, the second plurality include FinFET transistors formed by second gate features and second fin active lines, the second gate features are arranged to have a third pitch in the second direction, and the second fin active lines are arranged to have a fourth pitch in the first direction; and
a second SRAM macro, wherein the second SRAM macro includes a third plurality of single-port SRAM cells and a fourth plurality of peripheral logic circuits, the third plurality are arranged to have a fifth pitch in the first direction and a sixth pitch in the second direction, the third plurality include FinFET transistors formed by third gate features and third fin active lines, the fourth plurality include FinFET transistors formed by fourth gate features and fourth fin active lines, the fourth gate features are arranged to have the third pitch in the second direction, and the fourth fin active lines are arranged to have the fourth pitch in the first direction,
wherein:
the second pitch is about twice of the third pitch;
the sixth pitch is about the same as the second pitch; and
the fifth pitch is greater than the first pitch by about twice of the fourth pitch.

10. The semiconductor device of claim 9, wherein a ratio between the first pitch and the fourth pitch is one of: 8, 8.5, and 9.

11. The semiconductor device of claim 9, wherein a ratio between the first pitch and the fourth pitch is one of: 10, 10.5, and 11.

12. The semiconductor device of claim 9, wherein a ratio between the first pitch and the second pitch is in a range from about 2.25 to about 2.28.

13. The semiconductor device of claim 9, wherein:
a ratio between the first pitch and the fourth pitch is not an integer; and
twice of the ratio is an integer.

14. The semiconductor device of claim 9, wherein:
power supply lines, bit lines, and bit bar lines of the first plurality are routed in a first metal layer;
word lines and ground lines of the first plurality are routed in a second metal layer; and
the first metal layer is located between the second metal layer and a layer of the semiconductor device that has the first fin active lines.

15. The semiconductor device of claim 9, wherein:
word lines of the first plurality are routed in a first metal layer;
power supply, bit lines, bit bar lines, and ground lines of the first plurality are routed in a second metal layer; and
the first metal layer is located between the second metal layer and a layer of the semiconductor device that has the first fin active lines.

16. A semiconductor device comprising:
a first SRAM macro, wherein the first SRAM macro includes a first plurality of single-port SRAM cells and a second plurality of peripheral logic circuits, the first plurality are arranged to have a first pitch in a first direction and a second pitch in a second direction orthogonal to the first direction, the first plurality include first FinFET transistors formed by first gate features and first fin active lines, the second plurality include second FinFET transistors formed by second gate features and second fin active lines, the second gate features are arranged to have a third pitch in the second direction, and the second fin active lines are arranged to have a fourth pitch in the first direction; and
a second SRAM macro, wherein the second SRAM macro includes a third plurality of two-port SRAM cells and a fourth plurality of peripheral logic circuits, the third plurality are arranged to have a fifth pitch in the first direction and a sixth pitch in the second direction, the third plurality include third FinFET transistors formed by third gate features and third fin active lines, the fourth plurality include fourth FinFET transistors formed by fourth gate features and fourth fin active lines, the fourth gate features are arranged to have the third pitch in the second direction, and the fourth fin active lines are arranged to have the fourth pitch in the first direction,
wherein:
the second pitch is about twice of the third pitch;
the sixth pitch is about the same as the second pitch;
a first ratio between the first pitch and the fourth pitch is not an integer; and
a second ratio between the fifth pitch and the fourth pitch is an integer.

17. The semiconductor device of claim 16, wherein the first ratio is 10.5 and the second ratio is 15.

18. The semiconductor device of claim 16, wherein each of the first FinFET transistors is formed with one gate feature over one fin active line.

19. The semiconductor device of claim 16, wherein at least two of the first FinFET transistors are formed with one gate feature over two fin active lines.

20. The semiconductor device of claim 16, wherein:
the two-port SRAM cell includes a write-port portion and a read-port portion; and
the write-port portion is substantially the same as the single-port SRAM cell.

* * * * *